(12) United States Patent
Kobayashi

(10) Patent No.: US 7,666,016 B2
(45) Date of Patent: Feb. 23, 2010

(54) IC SOCKET

(75) Inventor: Masahiko Kobayashi, Sagamihara (JP)

(73) Assignee: 3M Innovative Properties Company, St. Paul, MN (US)

( * ) Notice: Subject to any disclaimer, the term of this patent is extended or adjusted under 35 U.S.C. 154(b) by 210 days.

(21) Appl. No.: 11/568,956

(22) PCT Filed: Apr. 13, 2005

(86) PCT No.: PCT/US2005/012521

§ 371 (c)(1),
(2), (4) Date: Nov. 10, 2006

(87) PCT Pub. No.: WO2005/115069

PCT Pub. Date: Dec. 1, 2005

(65) Prior Publication Data

US 2008/0188110 A1    Aug. 7, 2008

(30) Foreign Application Priority Data

May 14, 2004    (JP) .............................. 2004-145262

(51) Int. Cl.
*H01R 13/62* (2006.01)
(52) U.S. Cl. ........................ 439/296; 439/331
(58) Field of Classification Search ............... 439/296, 439/71, 330, 331, 68, 69, 70, 72, 73, 66, 439/266, 268, 259, 263, 264, 265
See application file for complete search history.

(56) References Cited

U.S. PATENT DOCUMENTS

| | | | |
|---|---|---|---|
| 5,498,970 A | 3/1996 | Petersen | |
| 5,807,127 A * | 9/1998 | Ohshima | ................... 439/266 |
| 6,262,581 B1 | 7/2001 | Han | |
| 6,280,219 B1 | 8/2001 | Sano et al. | |
| 6,322,384 B1 | 11/2001 | Ikeya | |
| 6,350,138 B1 | 2/2002 | Atobe et al. | |
| 6,375,484 B1 | 4/2002 | Shimada | |

(Continued)

FOREIGN PATENT DOCUMENTS

| | | |
|---|---|---|
| JP | 2003-115361 | 4/2003 |
| JP | 2003-168532 | 6/2003 |
| JP | 2003-187937 | 7/2003 |

*Primary Examiner*—Edwin A. Leon
(74) *Attorney, Agent, or Firm*—Melanie G. Gover

(57) ABSTRACT

To provide an IC socket which reduces the operating force of a pressing member, enlarges the dimensions of a pressing surface of the pressing member, and prevents positional offset of the IC device while applying the pressing force. Means for Solution: An IC socket 10 is provided with a housing 14 having a support 12, a plurality of contacts 16, a pressing member 18 for pressing an IC device supported at the support toward a group of contacts, and a biasing mechanism 22 for generating a pressing force for pressing the IC device at the pressing member. The pressing member has a pivot 42 guided linearly on the housing and a pressing surface swingable about the pivot on the housing, while the biasing mechanism 22 applies a biasing force to the pivot of the pressing member so as to cause the pressing force at the pressing surface. The pressing surface of the pressing member moves in parallel displacement between an operating position where it is closest to the support and a first nonoperating position where it is away from the support and swings between the first nonoperating position and a second nonoperating position further away from the support.

11 Claims, 17 Drawing Sheets

U.S. PATENT DOCUMENTS

| | | |
|---|---|---|
| 6,638,091 B2 | 10/2003 | Yamagishi |
| 6,666,691 B2 * | 12/2003 | Ikeya ............................ 439/71 |
| 6,749,443 B2 * | 6/2004 | Sano et al. ..................... 439/71 |
| 6,875,025 B2 | 4/2005 | Hsu et al. |
| 6,899,558 B2 | 5/2005 | Okamoto |
| 7,214,084 B2 | 5/2007 | Hayakawa |
| 7,278,868 B2 | 10/2007 | Sato et al |
| 2001/0046795 A1 | 11/2001 | Ohshima et al. |
| 2002/0177347 A1 * | 11/2002 | Ogura ........................ 439/330 |
| 2003/0054675 A1 | 3/2003 | Ikeya |

\* cited by examiner

IC SOCKET

TECHNICAL FIELD

The present invention relates to an Integrated Circuit (IC) socket supporting an IC device in a detachable manner.

BACKGROUND ART

An IC socket is used in an electronic circuit of for example a computer etc., where exchange or change of number of IC devices is expected, as a kind of mounting connector for electrically connecting an IC device and the electronic circuit through a plurality of contacts built into the IC socket while supporting the IC device in a detachable manner. Further, there are known test IC sockets used when running conduction tests or other electrical tests on IC devices before mounting in electronic apparatuses.

Among conventional IC sockets, one is known configured so as to place the IC device on an electrically insulating housing in a state pressing it against the plurality of contacts built into the housing so as to make the plurality of leads of the IC device abut against and connect with the contact parts of the corresponding contacts by a predetermined contact pressure. For example, Patent Document 1 discloses an IC socket provided with an electrically insulating housing having a support for supporting an IC device, a plurality of contacts providing contact parts elastically displaceable at the support and built into the housing, a plurality of pressing members for pressing the IC device supported at the support so as to make the plurality of leads of the IC device abut against the contact parts of the corresponding contacts, a biasing mechanism for generating a pressing force for pressing the IC device at the pressing member, and an operating member for turning and operating the pressing member on the housing.

Each of the plurality of pressing members provided at the IC socket is pivotably attached to the housing through a pivot and has a pressing surface for pressing the IC device against an end away from the pivot. These pressing members are arranged around the support with their pressing surfaces facing the support sides and can be synchronously pivoted between closed positions applying pressing forces to the IC device supported at the support from the pressing surfaces and open positions moving the pressing surfaces away from the IC device. Further, the operating member is provided with a cover arranged to be able to move in parallel in a direction approaching or moving away from the housing. The cover is a frame-shaped member having a center opening and is designed to enable the IC device to be inserted into or taken out of the support of the housing through that center opening. Further, the biasing mechanism is provided with a plurality of spring members for elastically biasing the cover in a direction moving away from the housing and a plurality of operating pins for transmitting the spring forces applied to the cover from the spring members to the individual pressing members. Each operating pin is provided at the other end of each pressing member at the side opposite to the pressing member across from the pivot and is pivotably connected with the cover.

In the above configuration, in the state with no external force applied to the cover, the cover is held at a position away from the housing due to the biasing forces of the plurality of spring members. The plurality of pressing members are arranged at closed positions where the pressing surfaces are brought close to the support of the housing (or operating positions of the pressing surfaces) due to the relative positional relationship among the operating pins, the pivots, and the pressing surfaces. If pressing in the cover in the direction approaching the housing against the biasing forces of the spring members from this state, the pressing members will turn about the pivots and reach the open positions where the pressing members are moved away from the support (or non-operating positions of pressing surfaces). In this way, the pressing members are linked with the parallel displacement of the cover with respect to the housing and turn in a lever manner about the pivots between the closed positions and open positions.

When using the above IC socket, an IC device is inserted in the support of the housing of the IC socket mounted on a circuit board through the center opening of the cover in the state with the plurality of pressing members arranged at the open positions (that is, the states pressing in the cover). Next, the external force on the cover is released, the cover is made to move in parallel by the biasing forces of the spring members, and the pressing members are made to pivot to the closed positions linked with this. Due to this, the pressing members apply the spring forces of the spring members, transmitted through the operating pins from the cover to the pressing members, to the IC device when their pressing surfaces are in the operating positions and fixedly hold the IC device on the support. As a result, the plurality of contacts receive pressing forces from the plurality of leads of the IC device and elastically deform and the individual leads and contact parts of the contacts are brought into abutment under predetermined contact pressures to be electrically connected.

Note that IC sockets having lever type pressing members similar to the above are also disclosed in for example Patent Document 2 and Patent Document 3. In the IC sockets of Patent Documents 2 and 3, a plurality of links are interposed between the cover and a plurality of pressing members in a manner displaceable with respect to both. The pressing members have elongated holes at the opposite sides to the pressing surfaces across the pivots and receive shafts at first ends of the links connected to the covers at the other ends. Due to this, the pressing members turn in a lever manner about the pivots between the closed positions and open positions linked with the parallel displacement of the cover with respect to the housing through the links. Further, the spring forces of the spring members biasing the cover in a direction moving away from the housing are transmitted through the links to the pressing members and are applied to the IC device from the pressing surfaces as pressing forces.

[Patent Document 1] Japanese Unexamined Patent Publication (Kokai) No. 2003-115361

[Patent Document 2] Japanese Unexamined Patent Publication (Kokai) No. 2003-168532

[Patent Document 3] Japanese Unexamined Patent Publication (Kokai) No. 2003-187937

SUMMARY

Problems to be Solved by the Invention

In a conventional IC socket having lever like pressing members explained above, at least when the pressing members are at the closed positions, the pivots forming the fulcrums of the pressing members are arranged at substantially the centers of the lever points (operating pins and link shafts) and working points (pressing surfaces). That is, no multiplying-force actions are considered at the pressing members. The biasing forces by the spring members are applied to the IC device as pressing forces at substantially their original magnitudes. Here, the pressing force applied to the IC device corresponds to at least the contact pressure required between an individual lead and a contact part of the corresponding contact multiplied by exactly the number of leads and is for example a level of several kg. Therefore, in a conventional IC socket, the total spring force of the spring members biasing the cover in a direction moving away from the housing sometimes similarly became a level of several kg.

In such a configuration, when inserting the IC device to the support of the housing, it is necessary to push the cover toward the housing by a force of several kg. As a result, sometimes the circuit board mounting the IC socket is flexed over its allowable range and along with this the relative amount of pressing of the cover to the housing becomes insufficient, the pressing members do not sufficiently pivot to the open positions, and accurate loading of the IC device to the support becomes difficult (this particularly becomes a problem at the time of use of an automatic loader). If giving multiplying-force actions to the pressing members to avoid such an inconvenience, it would be necessary to increase the distance from the pivots of the pressing members to the lever points and as a result the housing would be enlarged in dimensions in particularly the lateral direction. Therefore, this is not preferable.

Further, in the above configuration, when making the pressing members move from the closed positions to the open positions, the amounts of movement of the lever points and the amounts of movement of the working points become substantially equal, so to restrict the amount of pushing of the cover to a range not impairing the operability and prevent the front ends at the working point (pressing surface) sides from interfering with loading of the IC device when moving the pressing members to the open positions (that is, moving the pressing surfaces to the nonoperating positions), restrictions occur on the dimensions of the pressing surfaces of the pressing members. As a result, the dimensions of the pressing surfaces of the pressing members tend to become relatively small compared with the dimensions of the IC device and the pressing forces easily concentrate at local areas of the IC device, so particularly thin IC devices are liable to be damaged.

Further, in the above configuration, the pressing surfaces of the pressing members are designed to apply pressing forces to the IC device while turning around the pivots. Therefore, right before the pressing surfaces reach the operating positions and after the pressing surfaces contact the IC device, sometimes a slight positional offset occurs in the IC device on the support due to the slight turning of the pressing surfaces. Such positional offset of the IC device is liable to make securing an accurate and stable connection between the leads and contact parts of the contacts difficult.

An object of at least one embodiment of the present invention is to provide an IC socket provided with a pressing member for pressing an IC device against a plurality of contacts wherein the operating force for making the pressing member move from a closed position to an open position is reduced without enlarging the dimensions of the housing.

Another object of at least one embodiment of the present invention is to provide an IC socket provided with a pressing member for pressing an IC device against a plurality of contacts wherein the dimensions of the pressing surface of the pressing member are enlarged without interfering with the loading of the IC device or impairing the operability of the pressing member.

Still another object of at least one embodiment of the present invention is to provide an IC socket provided with a pressing member for pressing an IC device against a plurality of contacts wherein positional offset of the IC device is prevented from occurring while the pressing member applies a pressing force to the IC device.

Means for Solving the Problem

To achieve the above objects, at least one embodiment of the invention set forth in claim 1 provides an IC socket comprising a housing having a support for supporting an IC device, a plurality of contacts with contact parts arranged elastically displaceably at said support, a pressing member for pressing said IC device supported at the support to make a plurality of leads of said IC device abut against said contact parts of said plurality of contacts, and a biasing mechanism for generating a pressing force for pressing said IC device at said pressing member, said IC socket characterized in that: said pressing member has a pivot guided linearly on said housing and a pressing surface swingable about said pivot on said housing, and said biasing mechanism applies a biasing force to said pivot of said pressing member so as to cause said pressing force at said pressing surface.

An embodiment of the invention set forth in claim 2 provides an IC socket, as set forth in claim 1, wherein said pressing surface of said pressing member moves, in translation or parallel displacement, between an operating position where it is closest to said support and a first nonoperating position where it is away from said support and swings between said first nonoperating position and a second nonoperating position further away from said support.

An embodiment of the invention set forth in claim 3 provides an IC socket, as set forth in claim 2, wherein said housing has a guide groove for engaging with said pivot and linearly guiding said pivot during a period when said pressing surface of said pressing member displaces between said operating position and said second nonoperating position.

An embodiment of the invention set forth in claim 4 provides an IC socket, as set forth in claim 2 or 3, further provided with a fixing structure for mechanically fixing said pressing member in a pivot direction when said pressing surface is at said operating position.

An embodiment of the invention set forth in claim 5 provides an IC socket, as set forth in any one of claims 1 to 4, further comprising an operating member for operating said pressing member to make said pressing surface displace on said housing, wherein said operating member is linked with said biasing mechanism.

An embodiment of the invention set forth in claim 6 provides an IC socket, as set forth in claim 5, wherein said pressing member receives operating force from said operating member at said pivot and has a receiving part separate from said pivot for receiving operating force from said operating member, and wherein a distance between said pressing surface and said pivot is larger than a distance between said receiving part and said pivot.

An embodiment of the invention set forth in claim 7 provides an IC socket, as set forth in claim 5 or 6, wherein said operating member is provided with a cover arranged to be able to move in a direction toward and away from said housing, and wherein said biasing mechanism is provided with an elastic member for elastically biasing said cover in a direction away from said housing and a lever for transmitting force applied to said lever from said elastic member to said pivot as said biasing force.

An embodiment of the invention set forth in claim 8 provides an IC socket, as set forth in claim 7, further comprising a second elastic member for elastically biasing said pressing member in a pivoting direction toward said support on said housing.

An embodiment of the invention set forth in claim 9 provides an IC socket, as set forth in claim 8, wherein a vertical modulus of elasticity of said second elastic member is smaller than a vertical modulus of elasticity of said elastic member biasing said cover.

An embodiment of the invention set forth in claim 10 provides an IC socket, as set forth in claim 8 or 9, further comprising a stopping element for stopping said pressing member at a predetermined pivot position against the biasing force of said second elastic member.

An embodiment of the invention set forth in claim 11 provides an IC socket, as set forth in any one of claims 7 to 10, wherein said lever is provided with a first engaging end for engaging with said cover in an interactive manner, a second engaging end for engaging with said pivot in an interactive manner, and an axis part positioned between said first engaging end and said second engaging end, and is attached at said axis part to said housing in a pivotable manner, and wherein a distance between said first engaging end and said axis part is larger than a distance between said second engaging end and said axis part.

Effects of the Invention

According to an embodiment of the invention set forth in claim 1, since the pivot forming the fulcrum of the pressing member is guided linearly and a biasing force is given to the pivot so as to cause generation of a pressing force at the pressing surface, the pressing surface can give a biasing force to the pivot to the IC device as a pressing force while moving along with direct action displacement of the pivot. Accordingly, compared with a conventional structure where a pressing surface of a pressing member presses an IC device while pivoting, it is possible to suppress positional offset of the IC device on the support when applying the pressing force. Further, since it is possible to impart of predetermined multiplying-force action to the biasing mechanism without affecting the shape or dimensions of the pressing member, it is possible to reduce the external force required for operating the pressing member compared with the conventional structure with no multiplying-force action.

According to an embodiment of the invention set forth in claim 2, it is possible to more reliably suppress positional offset of the IC device on the support when the pressing surface of the pressing member applies pressing force against the IC device.

According to an embodiment of the invention set forth in claim 3, the direct action operation of the pivot is stabilized across the entire range of displacement motion of the pressing member.

According to an embodiment of the invention set forth in claim 4, the pressing surface of the pressing member can efficiently apply the biasing force applied to the pivot as pressing force to the IC device.

According to an embodiment of the invention set forth in claim 5, since the operating force of the pressing member and the biasing force of the biasing mechanism are linked together, the reliability of the operation of the IC socket is improved.

According to an embodiment of the invention set forth in claim 6, the pressing member can turn about the pivot by the operating force received at its receiving part. At this time, the pressing surface can be made to move greatly even with a small amount of movement of the receiving part, so it is possible to enlarge the dimensions of the pressing surface of the pressing member without impairing the operability of the operating member or interfering with the loading of the IC device at the support. As a result, it is possible to avoid concentration of the pressing force at a local area of the IC device and in particular prevent damage to a thin IC device due to the pressing force.

According to an embodiment of the invention set forth in claim 7, it is possible to increase the elastic biasing force of the elastic member by the multiplying-force action suitably given to the lever and transmit it to the pivot of the pressing member. As a result, when loading the IC device at the support of the housing, the force pressing the cover toward the housing so as to operate the pressing member can be reduced compared with the conventional structure. Therefore, flexing of the mounting board at the time of loading of the IC device is suppressed. Even when using an automatic loader, it is possible to reliably press the cover to the housing and make the pressing member sufficiently displace. Therefore, it is possible to reliably load the IC device to the support.

According to an embodiment of the invention set forth in claim 8, it is possible to make the pressing member automatically return to its initial position when releasing the pressing force on the cover.

According to an embodiment of the invention set forth in claim 9, it is possible to suppress an increase in the pressing force on the cover for operating the pressing member.

According to an embodiment of the invention set forth in claim 10, it is possible to make the pressing member accurately move in parallel displacement while maintaining a predetermined pivot position.

According to an embodiment of the invention set forth in claim 11, it is possible to impart a required multiplying-force action to the lever.

DETAILED DESCRIPTION

Next, embodiments of the present invention will be explained in detail with reference to the attached drawings. Throughout the figures, corresponding constituent elements are assigned common reference notations.

Figure 1:
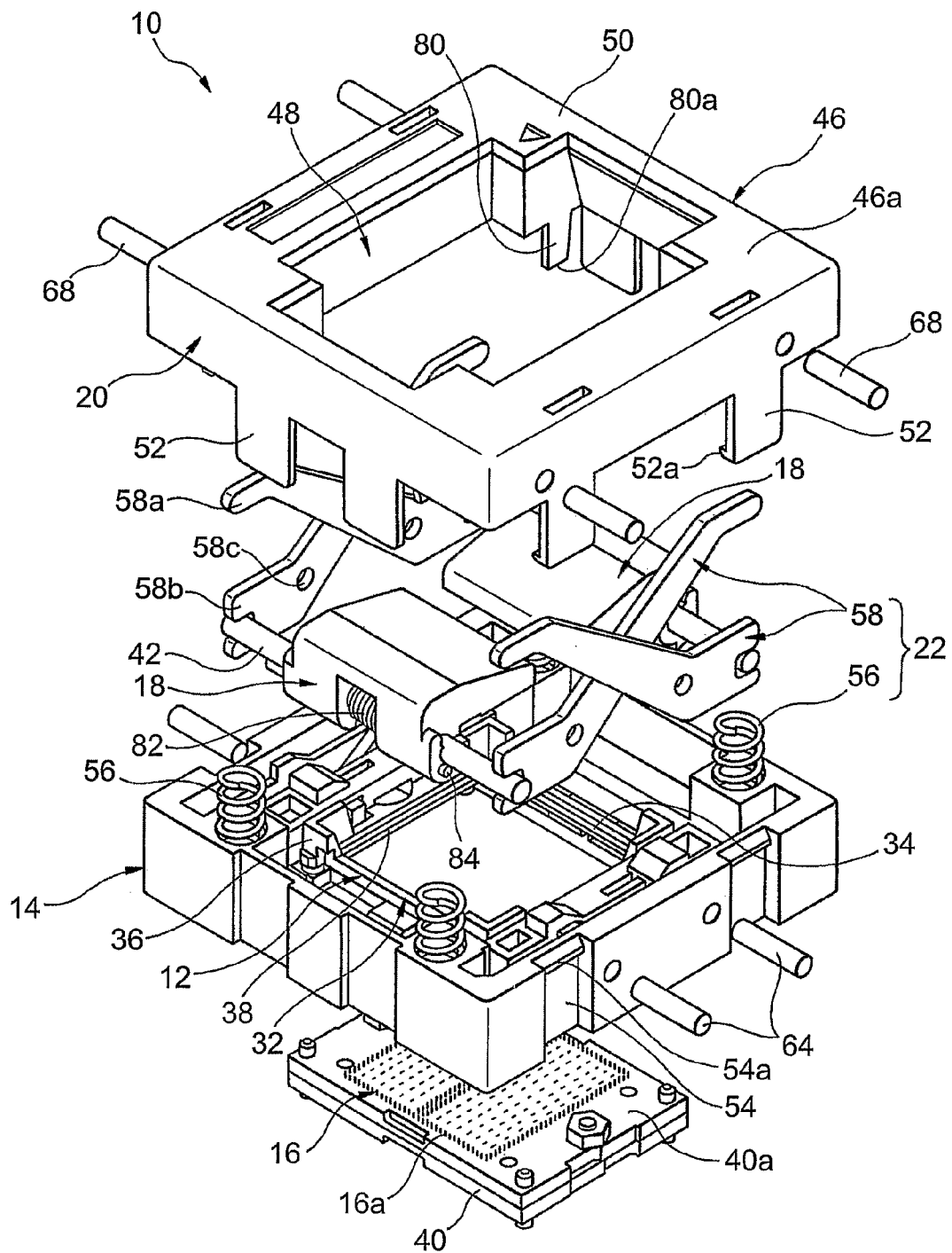
[FIG. 1] A disassembled perspective view of an IC socket according to an embodiment of the present invention.
Figure 2:
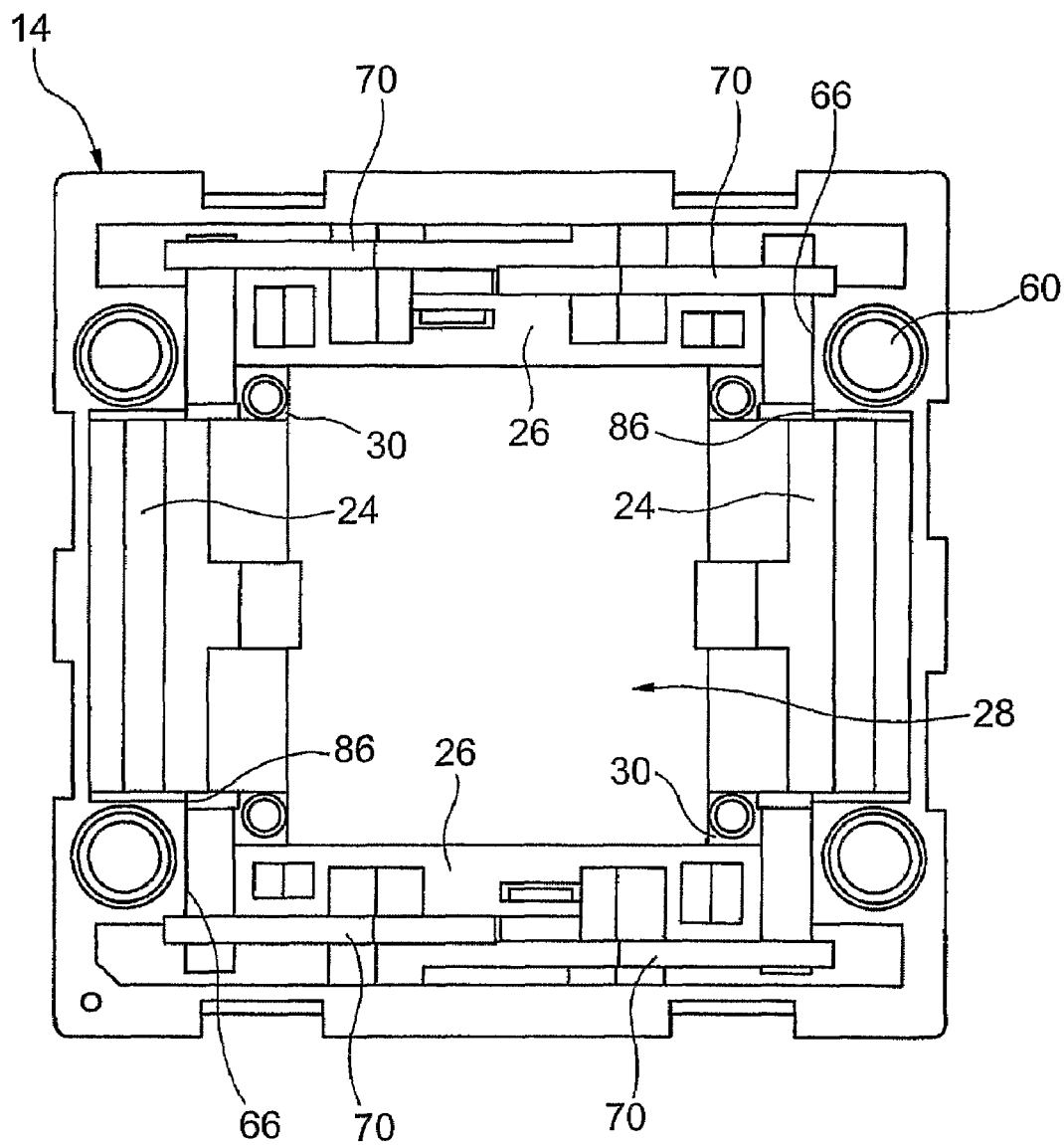
[FIG. 2] A plan view of a housing built in the IC socket of FIG. 1.
Figure 3:
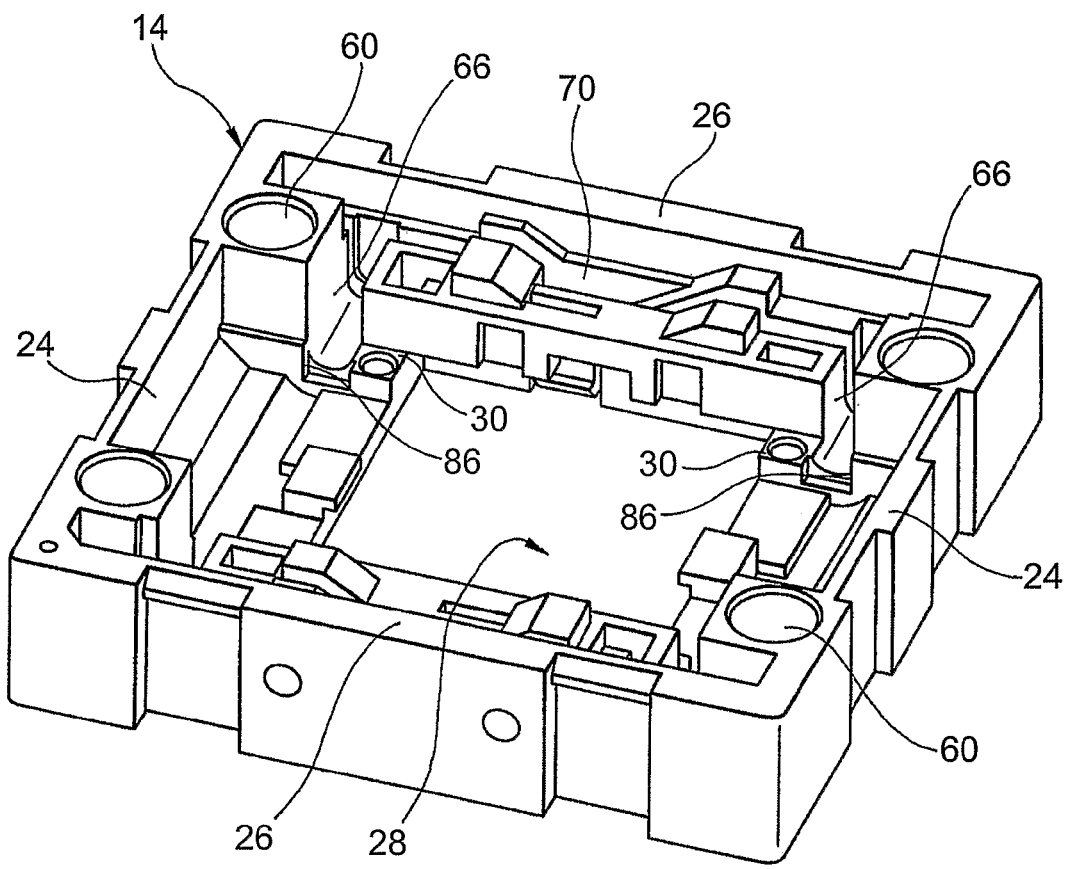
[FIG. 3] A perspective view of the housing of FIG. 2.
Figure 4:
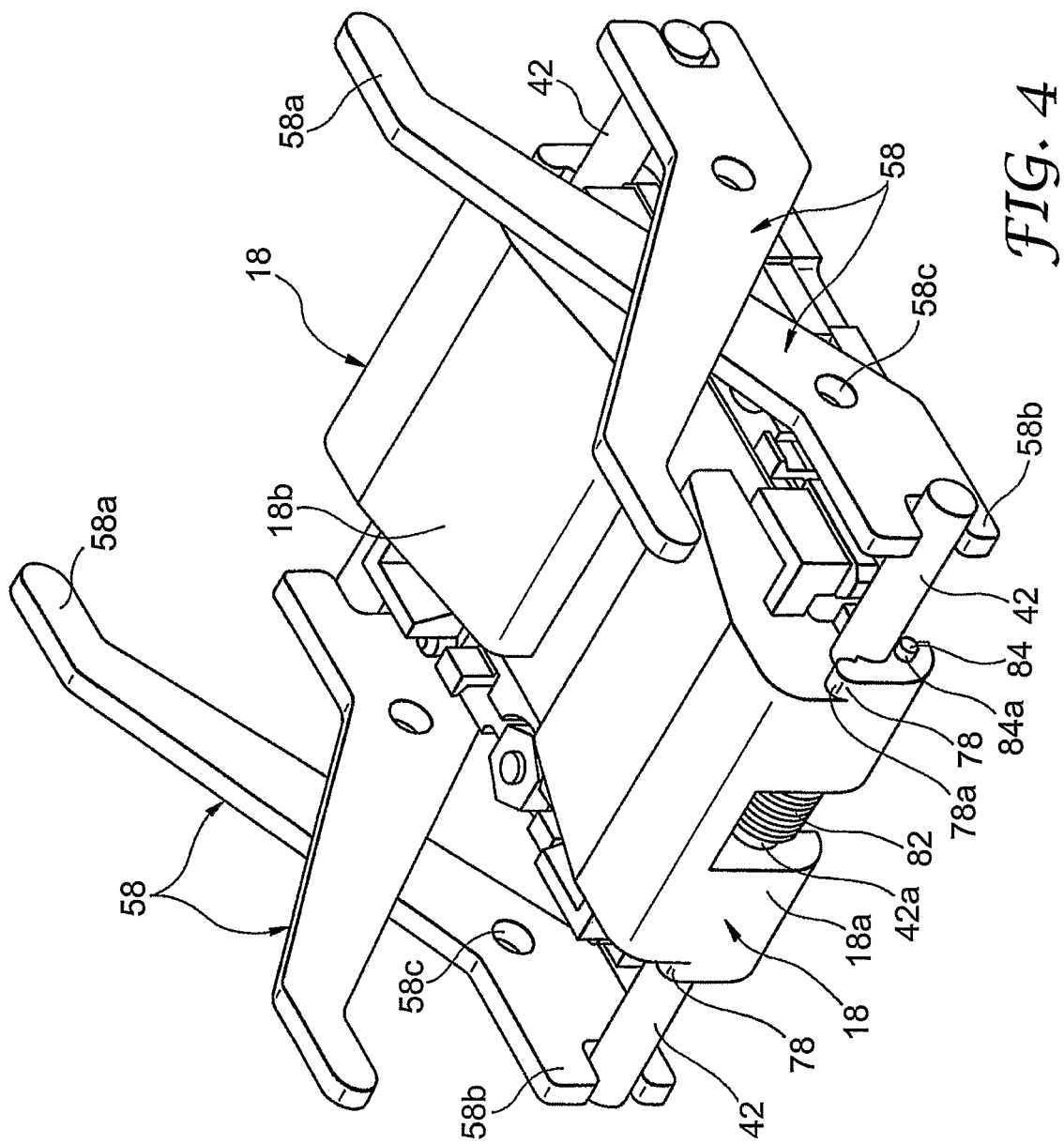
[FIG. 4] A perspective view showing enlarged pressing members and levers built in the IC socket of FIG. 1.
Figure 5:
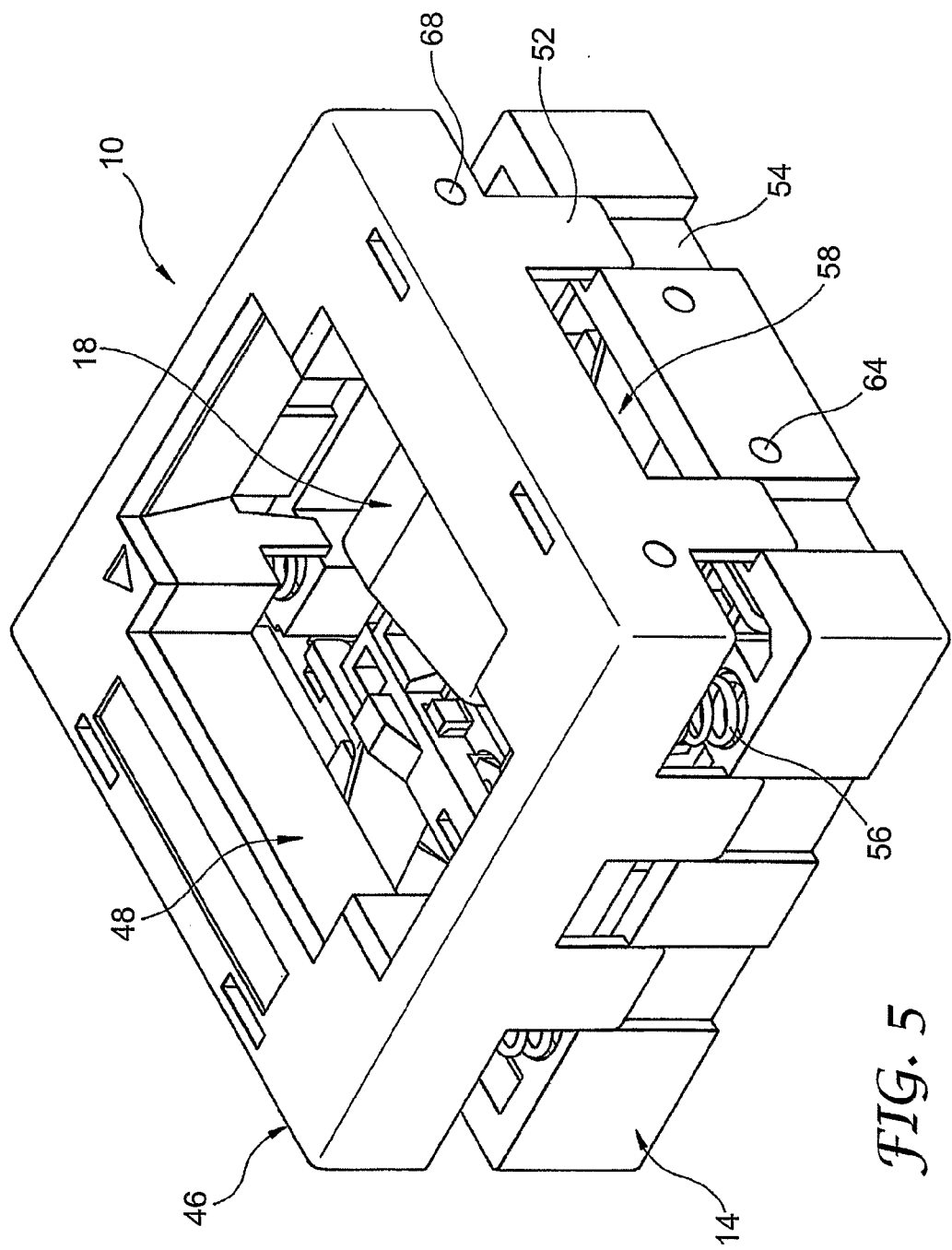
[FIG. 5] An assembled perspective view showing the IC socket of FIG. 1 in the state with the pressing members in closed positions.
Figure 6:
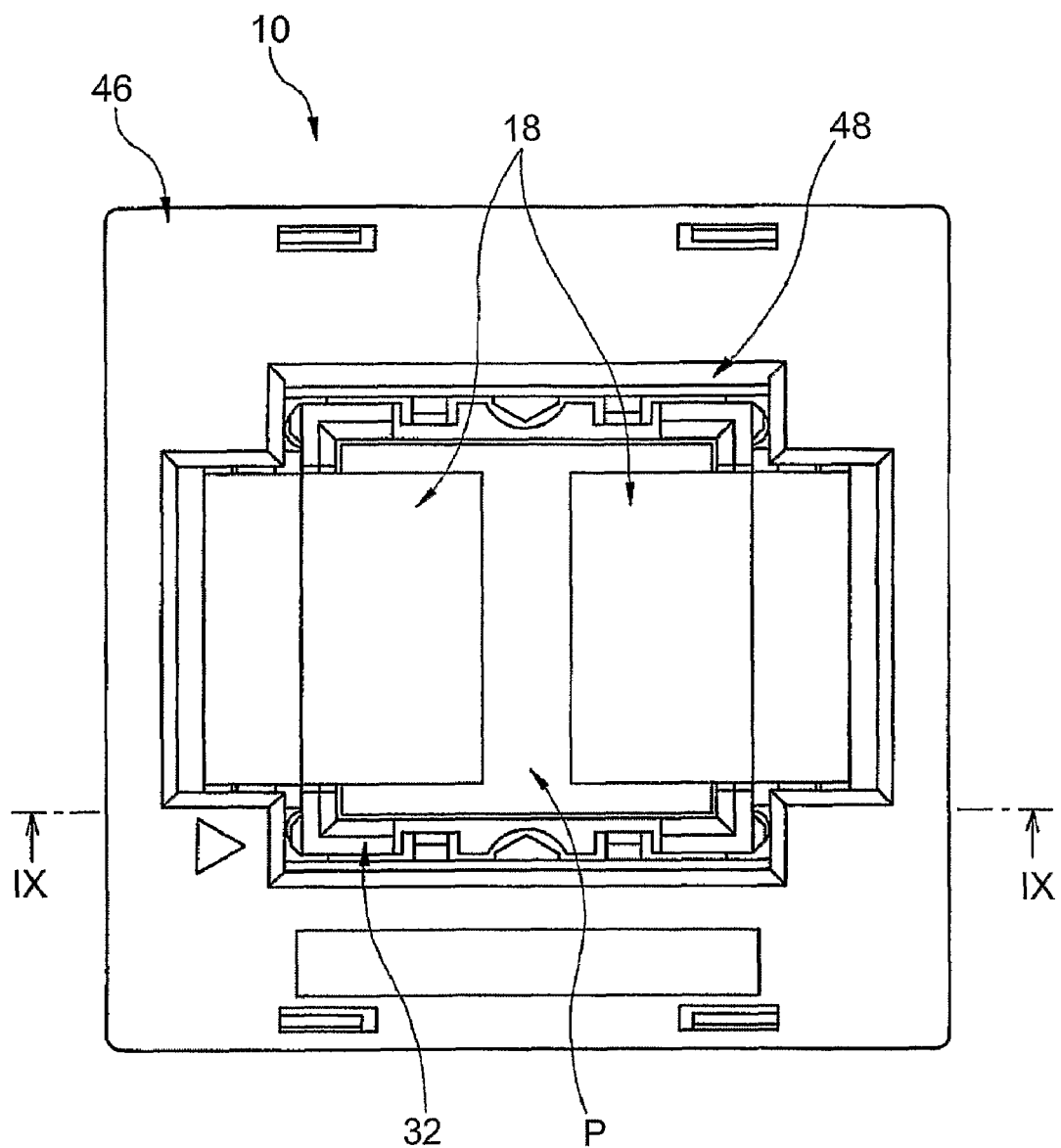
[FIG. 6] A plan view of the IC socket of FIG. 5.
Figure 7:
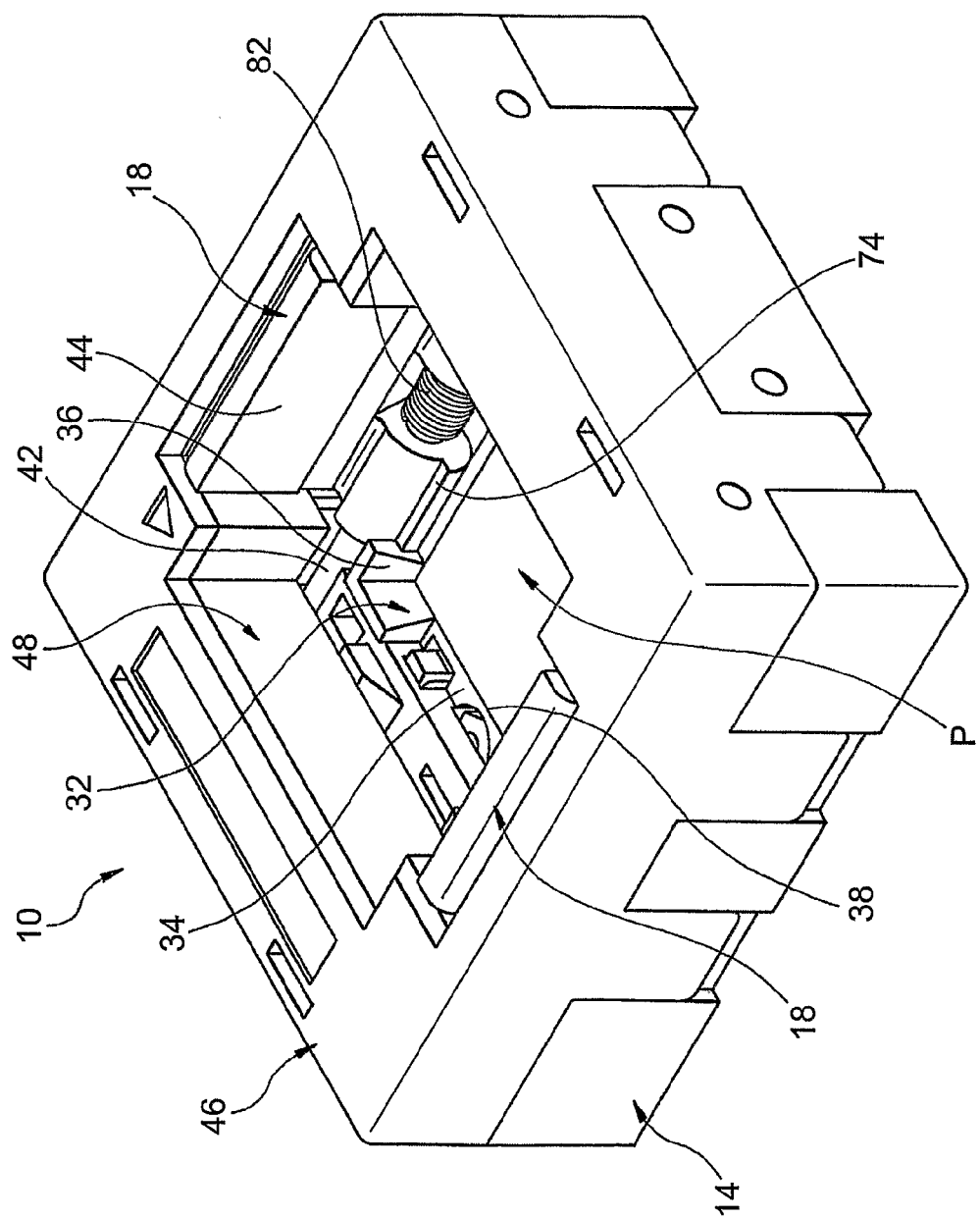
[FIG. 7] An assembled perspective view showing the IC socket of FIG. 1 in the state with the pressing members in open positions.
Figure 8:
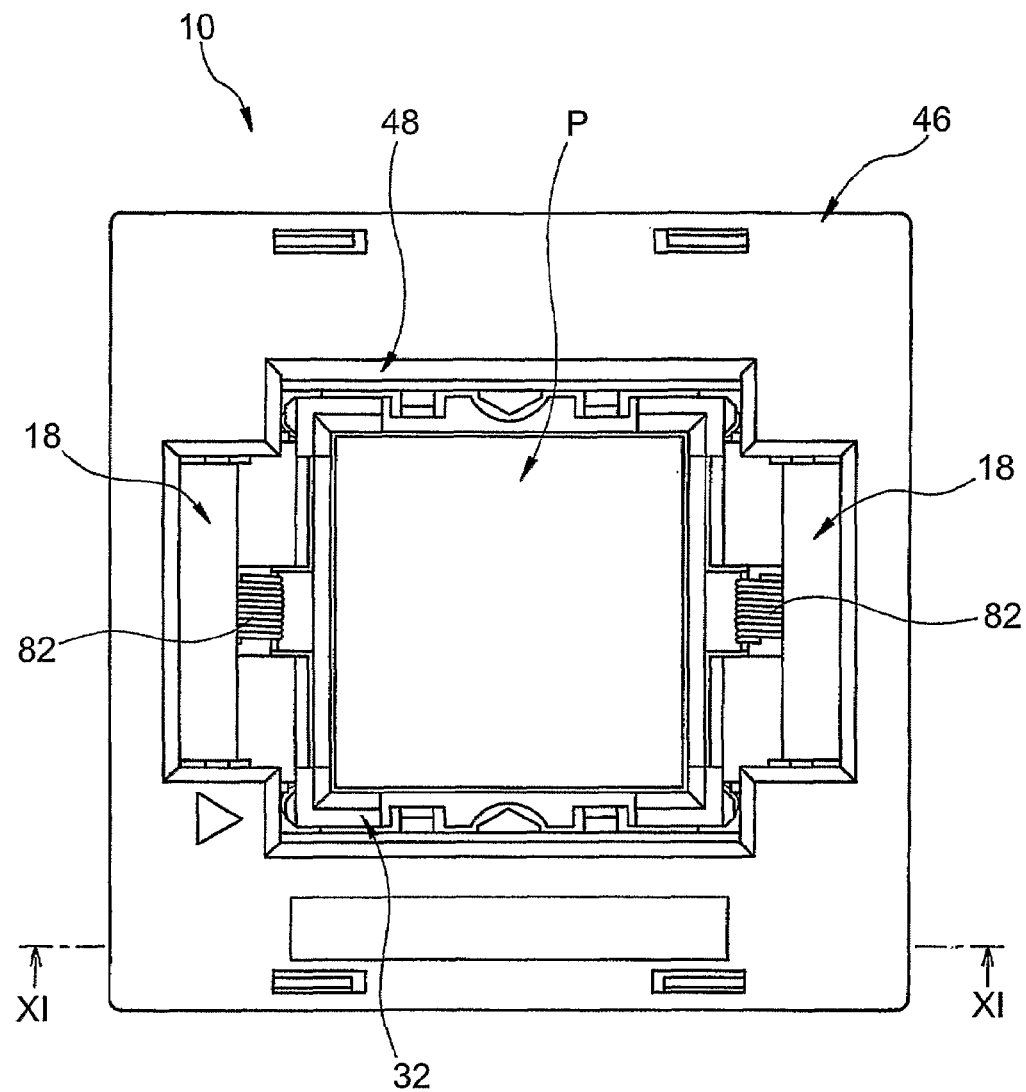
[FIG. 8] A plan view of the IC socket of FIG. 7.
Figure 9:
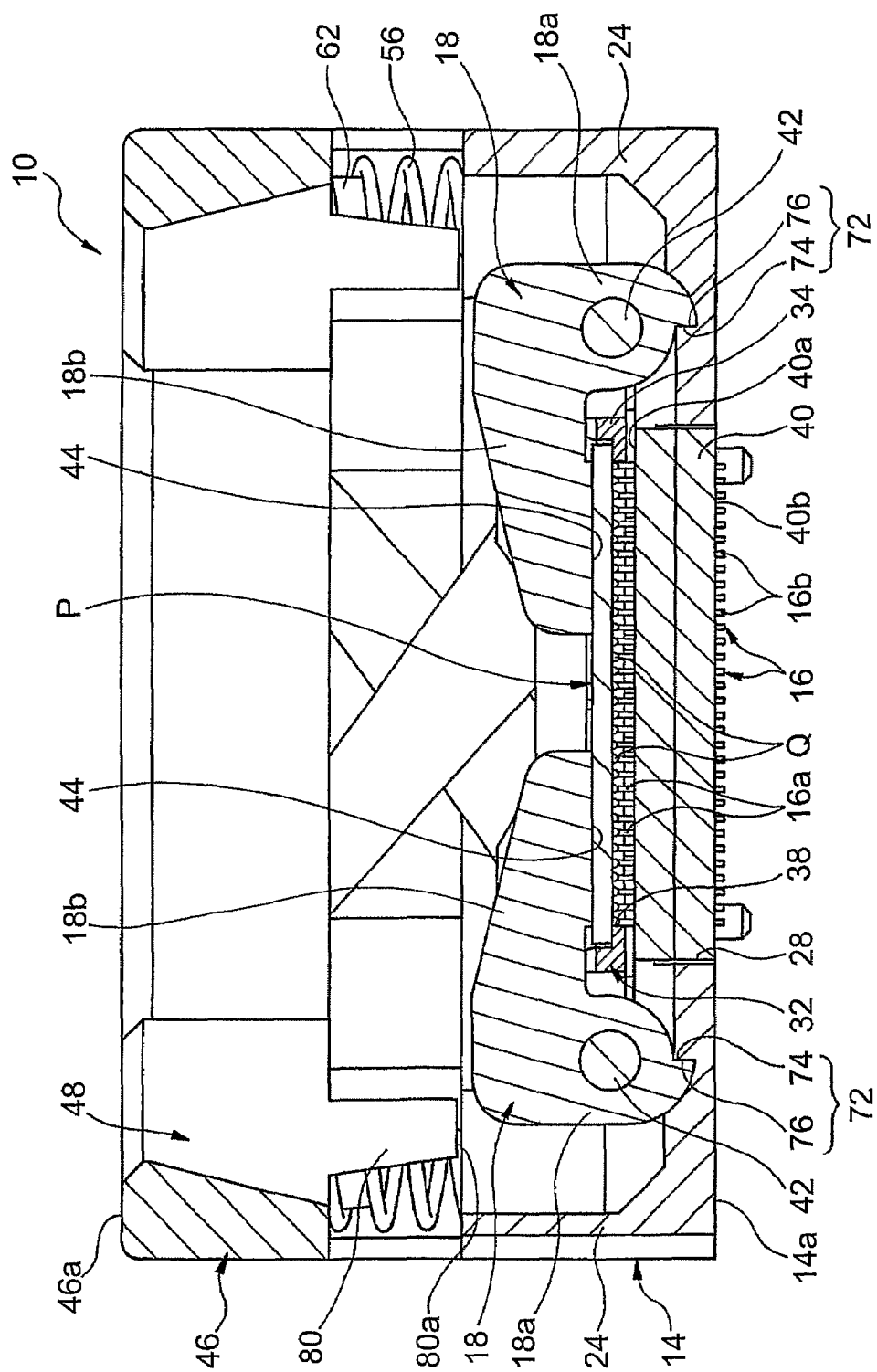
[FIG. 9] A cross-sectional view along the line IX-IX of FIG. 6 showing the IC socket of FIG. 1 in the state with the pressing members in closed positions.
Figure 10:
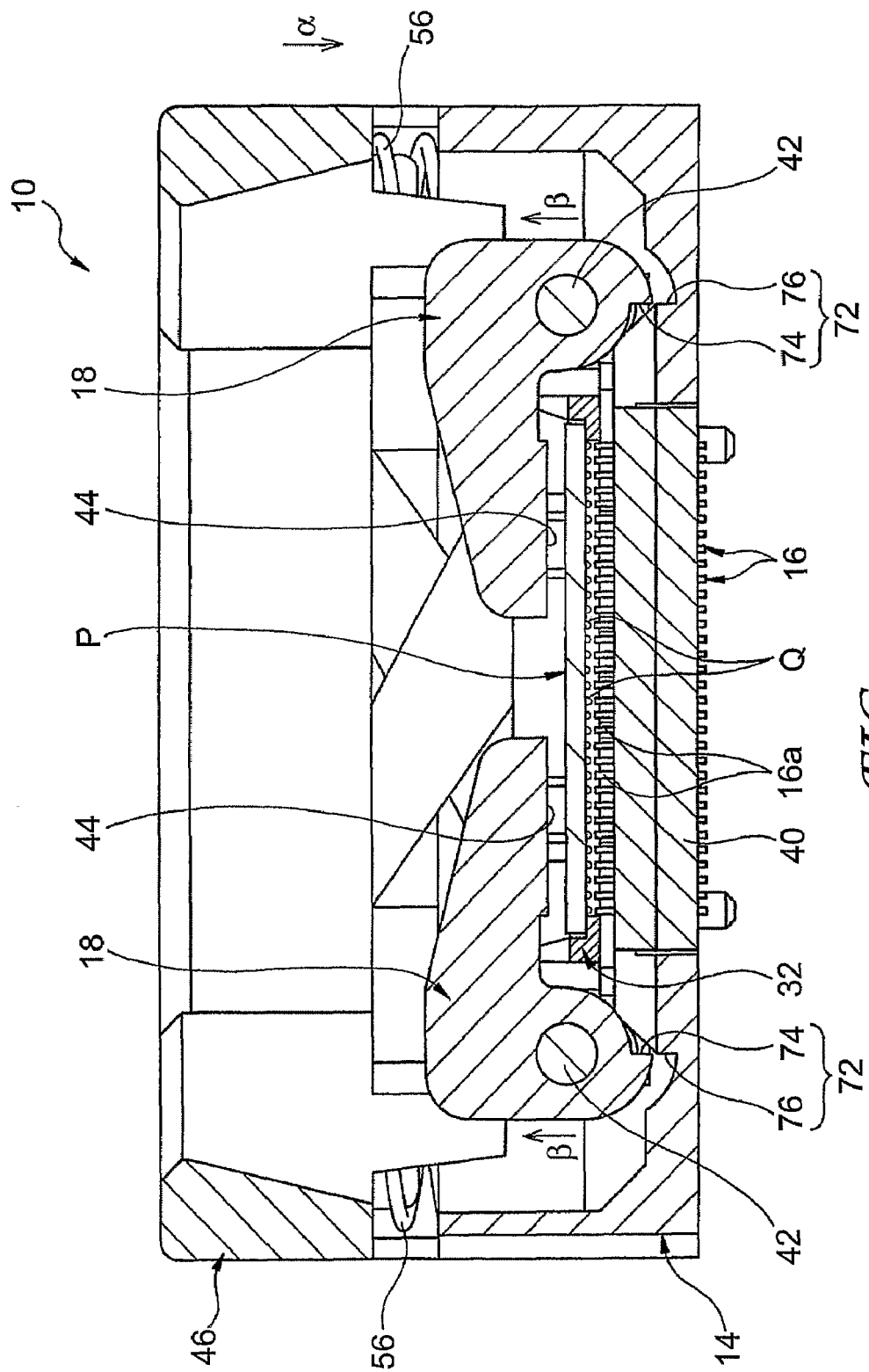
[FIG. 10] A cross-sectional view along the line IX-IX of FIG. 6 showing the IC socket of FIG. 1 in the state with the pressing members in intermediate positions.
Figure 11:
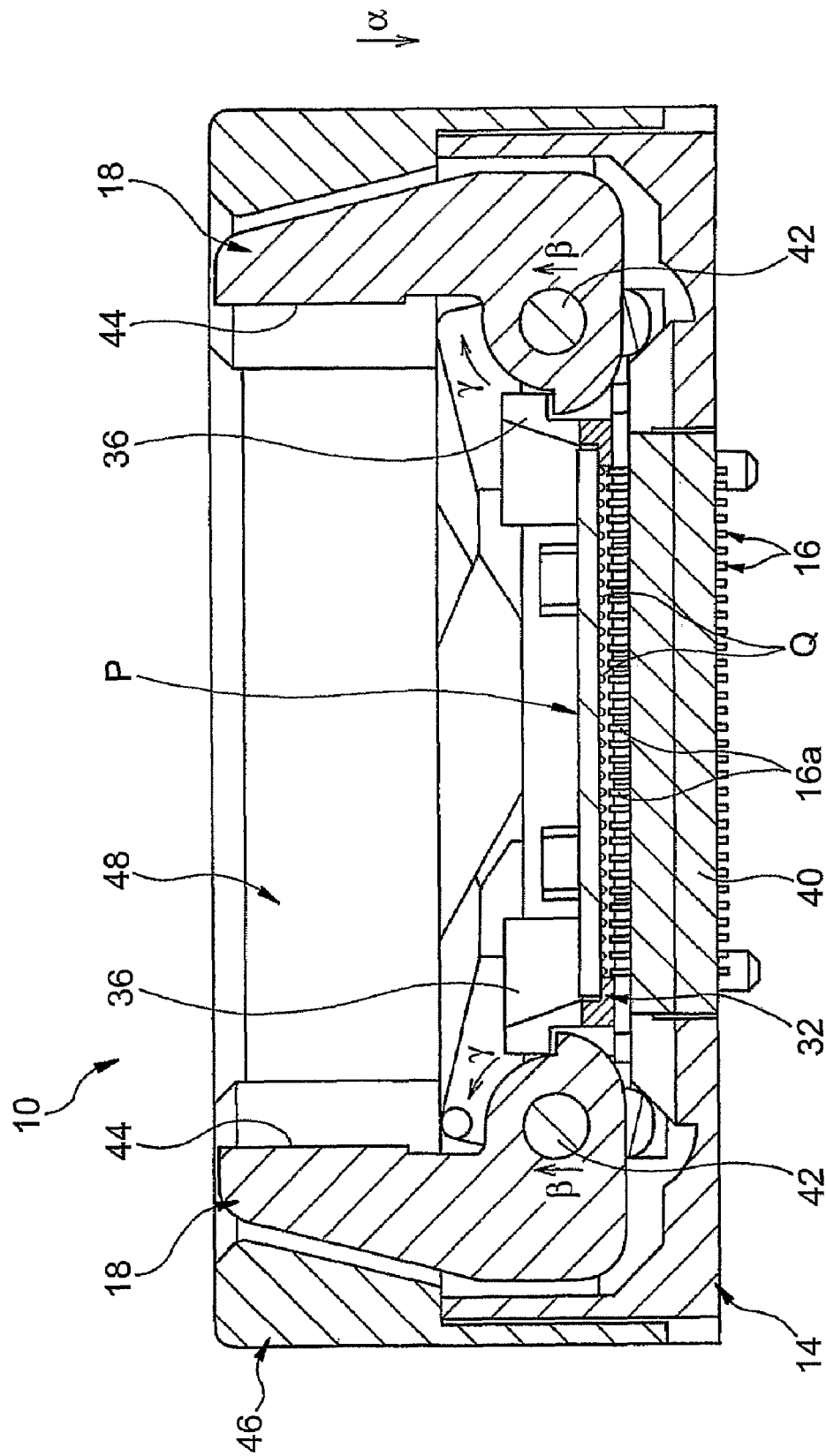
[FIG. 11] A cross-sectional view along the line IX-IX of FIG. 6 showing the IC socket of FIG. 1 in the state with the pressing members in open positions.

FIG. 1 is a disassembled perspective view of an IC socket 10 according to an embodiment of the present invention, FIG. 2 to FIG. 4 are views of different parts of the IC socket 10, FIG. 5 and FIG. 6 are views of the IC socket 10 in one operating state, FIG. 7 and FIG. 8 are views of the IC socket 10 in another operating state, and FIG. 9 to FIG. 11 are cross-sectional views of the IC socket 10 in other different operating states. Note that the illustrated IC socket 10 can be used for an IC device having an array type package structure having a large number of leads (that is, electrode pads) arranged in a rectangular grid or zigzag grid (for example, a BGA (ball grid array) or LGA (land grid array)), but the applications of the present invention are not limited to this.

As shown in FIG. 1, the IC socket 10 is provided with an electrically insulating housing 14 having a support 12 for supporting an IC device P (FIG. 9), a plurality of contacts 16 providing contact parts 16a elastically displaceably at the support 12 and built into the housing 14, pressing members 18 for pressing the IC device P supported at the support 12 so as to make the plurality of leads Q (FIG. 9) of the IC device P abut against the contact parts 16a of the corresponding contacts 16, an operating member 20 for operating the pressing members 18 on the housing 14, and a biasing mechanism 22 for generating pressing forces for pressing the IC device P at the pressing members 18.

The housing 14 is a frame-shaped member fabricated from an electrically insulating material superior in mechanical strength and having a substantially rectangular shape when seen in plan view. It has a substantially flat back surface 14a (FIG. 9) which is made to abut against a circuit board (not shown) mounting the IC socket 10. Further, the housing 14 is provided with a pair of first frame parts 24 formed along two facing sides of the substantially rectangular shaped contours, a pair of second frame parts 26 formed along the other two facing sides, and a center opening 28 of a substantially rectangular shape when seen in plan view defined by the insides of the first and second frame parts 24 and 26 (FIGS. 2 and 3). The first frame parts 24 are formed with receiving parts for receiving the pressing member 18 as explained later at the sides opposite to the back surface 14a (that is, at the top surfaces). The second frame parts 26 are formed at their top surfaces with receiving parts for receiving components of the biasing mechanisms 22 as explained later. Between adjoining first and second frame parts 24 and 26, seats 30 are provided adjoining the corners of the center opening 28 (FIGS. 2 and 3).

The support 12 of the housing 14 is comprised of a support guide member 32 (FIGS. 1, 7, 9 and 11) attached to the seats 30 provided adjoining the four corners of the center opening 28. The support guide member 32 is a frame shaped member fabricated from an electrically insulating material superior in mechanical strength and heat resistance and of a substantially rectangular shape when seen in plan view and is provided with a positioning support part 34 having an L-sectional shape and extending in a frame shape, guide parts 36 sticking out locally at the four corners of the positioning support part 34, and a center opening 38 of a substantially rectangular shape when seen in plan view defined by the insides of the positioning support part 34.

In the state with the support guide member 32 correctly attached to the housing 14, the center opening 38 of the support guide member 32 is arranged in register with the center opening 28 of the housing 14 and the plurality of leads Q of the IC device P supported at the positioning support part 34 are exposed at the back surface 14a of the housing 14. The support guide member 32 can be configured to be detachably attached to the seats 30 of the housing 14. In this case, it is possible to prepare a plurality of types of support guide members 32 with different frame dimensions of the positioning support parts 34 and suitably select and switch to a support guide member 32 of dimensions corresponding to the external dimensions of the IC device P using the IC socket 10.

The plurality of contacts 16 are held in a predetermined aligned array at a contact holding member 40 separate from the housing 14 (in FIG. 1, only part of the contacts 16 are shown). The contact holding member 40 is a plate-shaped member fabricated from an electrically insulating material superior in mechanical strength and heat resistance and of a substantially rectangular shape when seen from a plan view. Between its front surface 40a and back surface 40b, a plurality of through holes (not shown) for individually receiving the plurality of contacts 16 are formed in a rectangular grid array corresponding to the arrangement of the leads of the IC device P having an array type package structure using the IC socket 10. Therefore, the pitch of the through holes and the pitch of the contacts 16 are the same as the lead pitch of the IC device P concerned. The contact holding member 40 is attached in the center opening 28 of the housing so that its back surface 40b is arranged adjoining in a substantially planar state the back surface 14a of the housing 14 and to be superposed over the support guide member 32 (FIG. 9).

The contact holding member 40 can be configured to be able to be detachably attached to the center opening 28 of the housing 14. In this case, it is possible to prepare a plurality of types of contact holding member 40 with different arrays of contacts 16 and suitably select and switch to a contact holding member 40 of a contact array corresponding to the lead array of the IC device P using the IC socket 10.

Each of the plurality of contacts 16 is a pin-shaped conductor comprised of a material with a good electrical conductivity and is provided with a contact part 16a at one end sticking out from the front surface 40a of the contact holding member 40, a tail part 16b at the other end sticking out from the back surface 40b of the contact holding member 40, and an elastically deformable intermediate part (not shown) interposed between the contact part 16a and the tail part 16b and accommodated in the contact holding member 40. When correctly attaching the contact holding member 40 to the housing 14, the contact parts 16a of the plurality of contacts 16 are arranged projecting into the center opening 38 of the support guide member 32 forming the support 12 (FIG. 9). At the time of use of the IC socket 10, the contacts 16, as explained later, are made to abut against and be conductively connected to the leads Q of the IC device P (FIG. 9) at the contact parts 16a using as contact pressure the reaction caused by the elastic deformation of the intermediate parts and are conductively connected to the test circuit etc. of an external circuit board (not shown) by the tail parts 16b.

The IC socket 10 is provided with a plurality of (in the illustrated embodiment, pair of) pressing members 18 pivotably attached to the housing 14 through pivots 42 (FIG. 1). The pressing members 18 are members fabricated from electrically insulating materials superior in mechanical strength and heat resistance and of substantially rectangular shapes when seen in plan view and substantially L-sectional shapes when seen in side view and have base parts 18a provided fixed or able to pivot relative to the pivots 42 and arm parts 18b extending bent to L-shapes from the base parts 18a (FIG. 4). Further, the pressing members 18 have flat pressing surfaces 44 for pressing against the IC device P at end regions of the arm parts 18b away from the pivots 42 (FIG. 9).

The pair of pressing members 18 are arranged along the pair of facing sides of the positioning support member 34 of the support guide member 32 with their base parts 18a accommodated at the top surface side of the two first frame parts 24 of the housing 14 and with their pressing surfaces 44 oriented to be able to face the support guide member 32. In this state, the pressing members 18 can turn about the pivots 42 between closed positions where the pressing surfaces 44 are closest to the support guide member 32 (or the support 12) (that is, the later explained operating positions of the pressing surfaces 44) (FIGS. 5, 6 and 9) and the open positions where the pressing surfaces 44 are moved away from the support guide member 32 (that is, the later explained nonoperating positions of the pressing surfaces 44) (FIGS. 7, 8, 10 and 11).

The operating member 20 of the IC socket 10 is comprised of a cover 46 arranged to be able to move, in translation or parallel displacement, in directions approaching and moving away from the housing 14 (FIG. 1). The cover 46 is a frame shaped member fabricated from an electrically insulating material superior in mechanical strength and heat resistance and of a substantially rectangular shape seen in plan view and has a substantially flat top surface 46a forming part of the outer surface of the IC socket 10. Further, the cover 46 is provided with a surrounding wall 50 defining a center opening 48 and a plurality of engagement pieces 52 extending locally at the side opposite to the top surface 46a at desired locations of the surrounding wall 50. These engagement pieces 52 are complementarily slidingly received at a plurality of grooves 54 (FIG. 1) locally formed at the outer surfaces of the first and second frame parts 24 and 26 of the housing 14.

The cover 46 is attached to the housing 14 in a state with a plurality of engagement pieces 52 received in the corresponding grooves 54 of the housing 14. In this state, the cover 46 can be moved with respect to the housing 14 in a direction substantially perpendicularly intersecting the top surface 46a and bottom surface 14b (hereinafter referred to as the "vertical direction") while maintaining the top surface 46a and the back surface 14a parallel due to the mutual guide actions of the engagement pieces 52 and the grooves 54. Note that it is possible to provide between the cover 46 and housing 14 at both the desired engaging pieces 52 and grooves 54 complementary engagable catches 52a and 54a for preventing the cover 46 from detaching from the housing 14 (FIG. 1).

In the state with the cover 46 correctly assembled with the housing 14, the center opening 48 of the cover 46 is arranged at a position surrounding the support guide member 32 attached to the housing 14, when seen in plan view (FIG. 6). In this state, if moving the pair of pressing members 18 to the open positions (that is, moving the two pressing surfaces 44 to the nonoperating positions), it is possible to insert or take out the IC device P to or from the support guide member 32 on the housing 14 through the center opening 48 of the cover 46. Note that the operating states of the two pressing members 18 by the cover 46 will be explained later.

The biasing mechanism 22 of the IC socket 10 is provided with a plurality of (in the illustrated embodiment, four) elastic members 56 for elastically biasing the cover 46 in a direction moving away from the housing 14 and a plurality of (in the illustrated embodiment, two pairs of) levers 58 for transmitting the elastic biasing forces applied from the elastic members 56 to the cover 46 to the individual pressing members 18 (FIG. 1). The elastic members 56 are comprised of compressed coil springs in the illustrated embodiment, are received at recesses 60 (FIG. 2) provided at the four corners of the housing 14 at end regions in the axial direction and are fit into projections 62 (FIGS. 9 and 12) locally sticking out at the side opposite to the top surface 46a at the four corners of the surrounding wall 50 of the cover 46 at the other ends in the axial direction. These elastic members 56 give the cover 46 a balanced elastic force across the entire range of movement of the cover 46 with respect to the housing 14 and, as explained later, give rise to the required pressing forces at the pressing surfaces 44 of the pair of pressing members 18 through the levers 58 when the cover 46 is arranged at the position furthest from the housing 14.

The levers 58 are elongated plate shaped members fabricated from an electrically insulating material superior in mechanical strength and heat resistance and are provided with first engaging ends 58a for engaging interactively with the cover 46, second engaging ends 58b for engaging interactively with the pivots 42 of the pressing members 18, and axis parts 58c positioned between the first engaging ends 58a and second engaging ends 58b (FIG. 4). The axis parts 58c of the levers 58 are formed as holes passing through the parts in the thickness direction and accommodate in a fixed or relatively movable manner the pivots 64 attached to the second frame parts 26 of the housing 14 in a fixed or relatively movable manner (FIG. 1). Due to this, the levers 58 are pivotably attached to the housing 14 through the pivots 64.

As the characterizing configuration of the present invention, the pivots 42 of the pressing members 18 are guided linearly on the housing 14 and the pressing surfaces are swingable with respect to the pivots 42 on the housing 14. Further, the biasing mechanism 22 applies biasing forces to the pivots 42 of the pressing members 18 to cause the generation of the required pressing forces at the pressing surfaces 44. Specifically, the pivots 42 are formed so as to stick outward coaxially from the two side surfaces of the base parts 18a of the pressing members 18 (FIG. 4). When the pivots 42 are comprised of separate members from the pressing members 18, the two end parts in the axial direction of one pivot 42 are arranged to stick out from the base part 18a of the pressing member 18. Further, the housing 14 is formed at the two second frame parts 26 at positions adjoining the first frame parts 24 with pairs of guide grooves 66 engaging with the pivots 42 and guiding the pivots 42 linearly in the vertical direction perpendicularly intersecting the housing back surface 14a (FIGS. 2 and 3). The two guide grooves 66 forming the pairs are arranged aligned in directions parallel to the axial lines of the pivots 64 of the levers 58. Due to this, the pivots 42 of the pair of pressing members 18 are arranged in parallel with each other on the housing 14.

Further, the two pairs of levers 58 of the biasing mechanism 22 arranged relative to each other so that the pair of levers 58 engaging with the pivot 42 of one pressing member 18 and the other pair of levers 58 engaging with the pivot 42 of the other pressing member 18 perpendicularly intersect each other in an X-fashion at the two sides of the pressing members 18. Further, the levers 58 slidingly engage with the pivot 42 of one pressing member 18 at the second engaging ends 58b and slidingly engage with a shaft 68 (FIG. 1) attached to the cover 46 at a position above the pivot 42 of the other pressing member 18 at the first engaging ends 58a. In this state, the levers 58 are swingably received in recesses 70 provided at the second frame parts 26 of the housing 14 (FIG. 2).

The levers 58 are formed so that the distances between the first engaging ends 58a and the axis parts 58c (that is, the pivots 64) become larger than the distances between the second engaging parts 58b and the axis parts 58c. Due to this, the levers can increase the forces applied to the first engaging ends 58a serving as the lever points from the levers 46 by using the pivots 64 as fulcrums and output them to the pivots 42 by the second engaging ends 58b serving as the working points. Therefore, in the IC socket 10, the elastic biasing forces applied from the four elastic members 56 to the cover 46 are increased through the individual levers 58 and transmitted as biasing forces to the pivots 42 of the pair of pressing members 18, whereupon the biasing forces act as pressing forces of the pressing surfaces 44. Further, if pressing in the cover 46 in a direction approaching the housing 14 against the biasing forces of the elastic members 56, the pressing force is increased through the individual levers 58 and transmitted as operating forces to the pivots 42 of the pair of pressing members 18, whereby the pivots 42 are made to move linearly along the guide grooves 66.

In this way, in the IC socket 10, the parallel displacement motion of the cover 46 (or the operating member 20) causing displacement of the pressing members 18 and the swinging motion of the levers 58 (or the biasing mechanism 22) giving rise to the pressing forces at the pressing members 18 are linked with each other. At this time, due to the action of the levers 58, the distances of movement in the vertical direction of the pivots 42 of the pressing members 18 becomes smaller than the distances of movement in the vertical direction of the cover 46.

In the IC socket 10, while the cover 46 is moving in parallel displacement in the vertical direction with respect to the housing 14, the pressing surfaces 44 of the individual pressing members 18 move in parallel displacement between the operating positions where they are arranged closest to the support guide member 32 (or the support 12) (that is, the closed positions of the pressing members 18) (FIG. 9) and the first nonoperating positions where they are slightly away from the support guide member 32 (that is, the intermediate positions of the pressing members 18) (FIG. 10) and swing between the first nonoperating positions and the second nonoperating positions where they are further away from the support guide member 32 (that is, the open positions of the pressing members 18) (FIG. 11). When an IC device P is placed on the support guide member 32, the pressing surfaces 44 of the pressing members 18 press the IC device P at the operating positions by the required pressing forces, move in parallel displacement from the operating positions toward the first nonoperating positions to move slightly away from the IC device P, then move sufficiently away from the IC device P by swinging from the first nonoperating positions toward the second nonoperating positions.

The IC socket 10 is further provided with fixing structures 72 for mechanically fixing the pressing members 18 in the pivot direction when the pressing surfaces 44 of the pressing members 18 are at the operating positions (FIG. 9). In the illustrated embodiment, the fixing structures 72 are comprised of shoulders 74 extending in the radial direction about the pivots 42 at the outside surfaces of the base parts 18a of the pressing members 18 and grooves 76 formed at the bottom parts of the first frame parts 24 near the center opening 28 of the housing 14 and engageable with the shoulders 74. The fixing structures 72 fixedly hold the pressing members 18 at the closed positions on the housing 14 so that the pressing surfaces 44 do not turn in a direction moving away from the support guide member 32 (or IC device P) when the pressing surfaces 44 of the pressing members 18 are at the operating positions. As a result, when the pressing members 18 are at the closed positions, the biasing forces transmitted to the pivots 42 of the pressing members 18 through the levers 58 are efficiently applied to the IC device P as pressing forces from the pressing surfaces 44 at the operating positions.

To make the pressing surfaces 44 of the pressing members 18 swings between the first nonoperating positions and second nonoperating positions due to the vertical direction movement of the cover 46 with respect to the housing 14, the pressing members 18 are configured so as not only to receive the operating force from the cover 46 (or the operating member 20) at the pivots 42 as explained above, but also receive the operating force from the cover 46 at the receiving parts 78 separately provided from the pivots 42 (FIG. 4). Here, the guide grooves 66 formed in the housing 14 act so as to successively guide the corresponding pivots 42 linearly while the pressing surfaces 44 of the pressing members 18 displace between the operating position an second nonoperating position, that is, the pressing members 18 displace between the closed positions and the open positions. Further, the pressing members 18 receive the operating force from the cover 46 at only the pivots 42 while the pressing surfaces 44 move in parallel displacement between the operating positions and the first nonoperating positions and receive the operating force from the cover 46 at both the pivots 42 and the receiving parts 78 while the pressing surfaces 44 swings between the first nonoperating positions and second nonoperating positions.

Specifically, the receiving parts 78 of the pressing members 18 have rising surfaces 78a provided so as to bulge out in the radial direction with respect to the center axial lines of the pivots at the two side surfaces of the pressing members 18 (FIG. 4). As opposed to this, the cover 46 is formed with four extension pieces 80 extending at opposite sides to the top surface 46a adjoining the center opening 48 in a manner engageable with the receiving parts 78 of the two pressing members 18 (FIGS. 1 and 9).

Due to the action of the levers 58 explained above, when the cover 46 is at the position furthest away from the housing 14, the pressing surfaces 44 of the pressing members 18 are arranged at the operating positions. At that time, the individual receiving parts 78 and corresponding extension pieces 80 are arranged furthest away from each other. As the cover 46 moves from this position in a direction approaching the housing 14, the pressing surfaces 44 of the pressing member 18 displace from the operating positions to the first nonoperating positions. Along with this, the individual receiving parts 78 and corresponding extension pieces 80 approach each other. Further, during movement of the cover 46 approaching the housing 14, when the pressing surfaces 44 of the pressing members 18 reach the first nonoperating positions, the extension pieces 80 strike the rising surfaces 78a of the receiving parts 78 of the pressing members 18 at their front end faces 80a.

Here, the front end faces 80a of the extension pieces 80 and the rising surfaces 78a of the receiving parts 78 strike each other at positions offset from the pivots 42 of the corresponding pressing members 18 in the radial direction toward the outer surfaces of the first frame parts 24 of the housing 14. Therefore, when moving the cover 46 further in a direction approaching the housing 14, the individual extension pieces 80 push the receiving parts 78 of the corresponding pressing members 18 to generate a torque about the pivots 42 with respect to the pressing members 18. Due to this, the pressing members 18 turn toward the open positions about the pivots 42 and the pressing surfaces 44 swing from the first nonoperating positions to the second nonoperating positions.

The pressing members 18 are formed so that the distances between the pressing surfaces 44 and the pivots 42 become larger than the distances between the rising surfaces 78a of the receiving parts 78 and the pivots 42. Due to this, the pressing members 18 can give rise to pivoting motions so that the amounts of swing of the pressing surfaces 44 at the working points become sufficiently larger than the vertical direction movement of the cover 46, that is, the extension pieces 80, when force is applied to the rising surfaces 78a of the receiving parts 78 serving as the lever points from the corresponding extension pieces 80 of the cover 46. Therefore, after the individual extension pieces 80 of the cover 46 strike the corresponding receiving parts 78 of the pressing members 18, the cover 46 is made to move by exactly a slight additional amount toward the housing 14, whereby the two pressing members 18 are made to pivot greatly and move to the open positions.

The IC socket 10 is further provided with second elastic members 82 for elastically biasing the individual pressing members 18 on the housing in the pivot direction whereby the pressing surfaces 44 approach the support guide member 32 (that is, the direction making the pressing surfaces 44 swing from the second nonoperating positions to the first nonoperating positions) (FIG. 1). In the illustrated embodiment, the base parts 18a of the pressing members 18 are provided with exposed shaft parts 42a arranged coaxially with respect to the pivots 42. The second elastic members 82 comprised of coil springs are attached to surround the exposed shaft parts 42a (FIG. 4). These second elastic members 82 act to make the corresponding pressing members 18 automatically pivot from the open positions to the closed positions when the forces applied from the extension pieces 80 of the cover 46 to the receiving parts 78 of the pressing members 18 are released.

In the above configuration, to make the pressing surfaces 44 of the pressing members 18 swing from the first nonoperating positions to the second nonoperating positions, it is necessary to push the cover 46 in toward the housing 14 by a force over the total biasing force of the four elastic members 56 and two second elastic members 82. Therefore, the second elastic members 82 are designed so that their vertical modulii of elasticity (or spring constants) become sufficiently smaller than the vertical modulii of elasticity (or spring constants) of the pressing members 56 biasing the cover 46. By doing this, it is possible to suppress to the minimum necessary extent the increase in external force applied to the cover 46 as the operating force of the pressing members 18.

The IC socket 10 is further provided with stopping elements 84 for stopping the pressing members 18 at predetermined pivot positions against the biasing forces of the second elastic members 82 so as to make the pressing surfaces 44 of the pressing members 18 move in parallel displacement between the operating positions and first nonoperating positions under the biasing forces of the second elastic members 82 (FIG. 1). In the illustrated embodiment, the stopping elements 84 have cylindrical surfaces 84a sticking out locally in parallel to and adjoining with the pivots 42 at positions somewhat separated from the rising surfaces 78 of the pressing members 18 in the circumferential directions of the pivots 42 (FIG. 4). As opposed to this, the housing 14 is formed with notches 86 adjoining the insides of the pairs of guide grooves 66 aligned in the axial direction and extending down near the back surface 14a further from the guide grooves 66 (FIGS. 2 and 3).

While the pressing surfaces 44 of the corresponding pressing members 18 are moving between the operating positions and the first nonoperating positions, the stopping elements 84 receive the biasing forces of the second elastic members 82 at their cylindrical surfaces 84a and engage slidingly with the edges of the corresponding notches 86. Due to this sliding engagement action of the stopping elements 84 and the notches 86, the pressing surfaces 44 of the pressing members 18 move in parallel displacement accurately between the operating positions and the first nonoperating positions. Note that the predetermined pivot positions of the pressing members 18 stopped by the stopping elements 84 are substantially the same as the pivot positions of the pressing members 18 when the pressing surfaces 44 are arranged at the operating positions.

Next, the mode of operation of the IC socket 10 having the above configuration will be explained in further detail with reference to FIG. 9 to FIG. 17. First, while the cover 46 is held at its maximum separation position the furthest from the housing 14 due to the elastic biasing forces of the plurality of elastic members 56, the pair of pressing members 18 are placed at the closed positions and their pressing surfaces 44 are at the operating positions closest to the support guide member 32 (or the support 12) of the housing 14. If an IC device P is placed at the support guide member 32 at this time, the pressing surfaces 44 of the pressing members 18 press the IC device P by the required pressing forces as explained below due to the action of the levers 58 explained above (FIG. 9).

Figure 12:
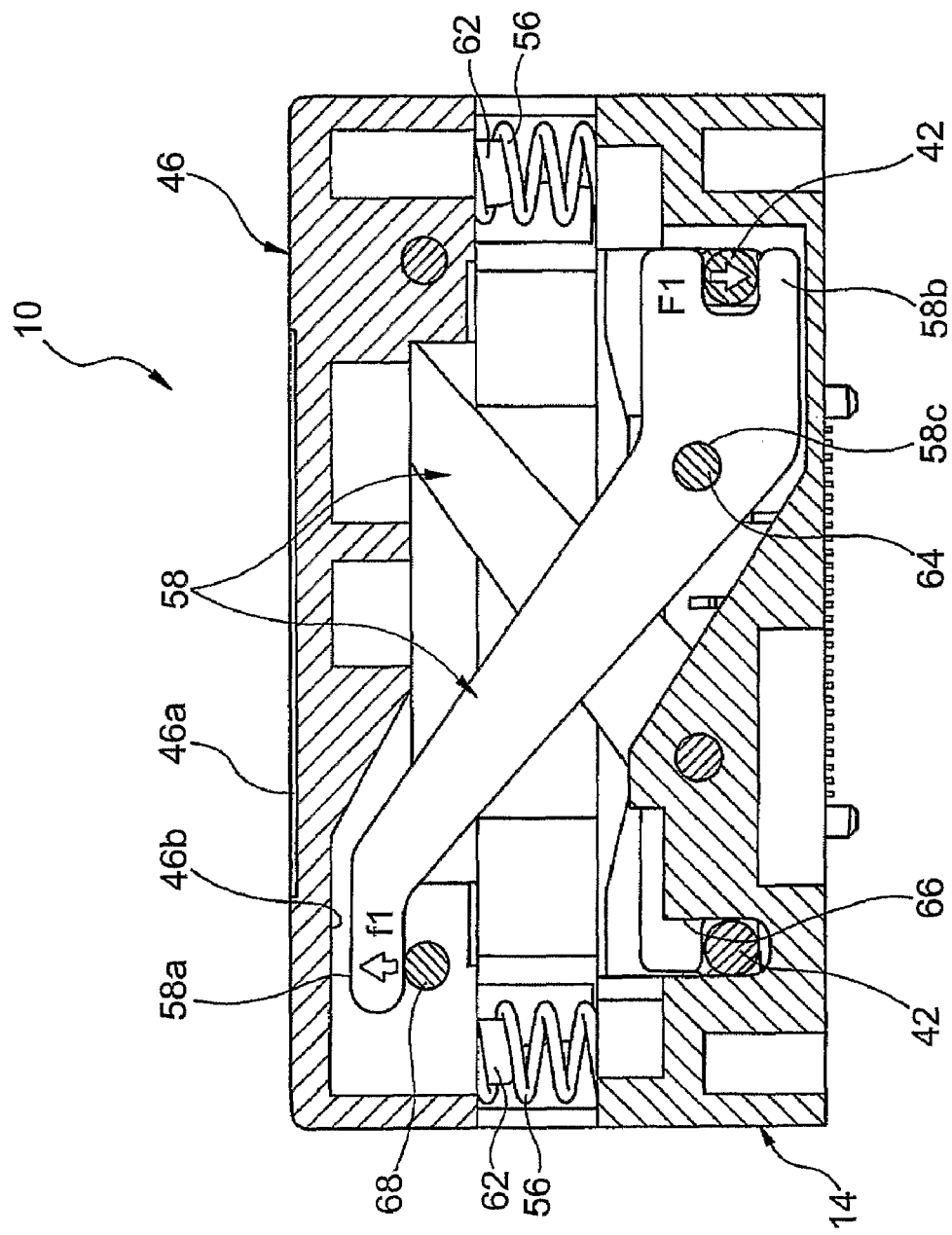
[FIG. 12] A cross-sectional view, along another line, of the IC socket of FIG. 1 with the pressing members in closed positions.

That is, as shown in FIG. 12, the levers 58 are inserted at their first engaging ends 58a between the back surface 46b of the cover 46 opposite to the top surface 46a and the shaft 68 attached to the cover 46 with slight play in the vertical direction. The split second engaging ends 58b slidingly receive the pivots 42 of the corresponding pressing members 18. Further, while the cover 46 is held at its maximum separation position, the elastic biasing forces of the four elastic members 56 are equally divided at the four shafts 68 and applied from the shafts 68 to the first engaging ends 58a of the corresponding levers 58 as the upward forces f1. These forces f1 are based on the vertical modulii of elasticity (or spring constants) of the elastic members 56, are increased by the multiplying-force action of the levers 58 explained above, and are applied from the second engaging ends 58b to the pivots 42 as the downward forces F1.

Figure 15:
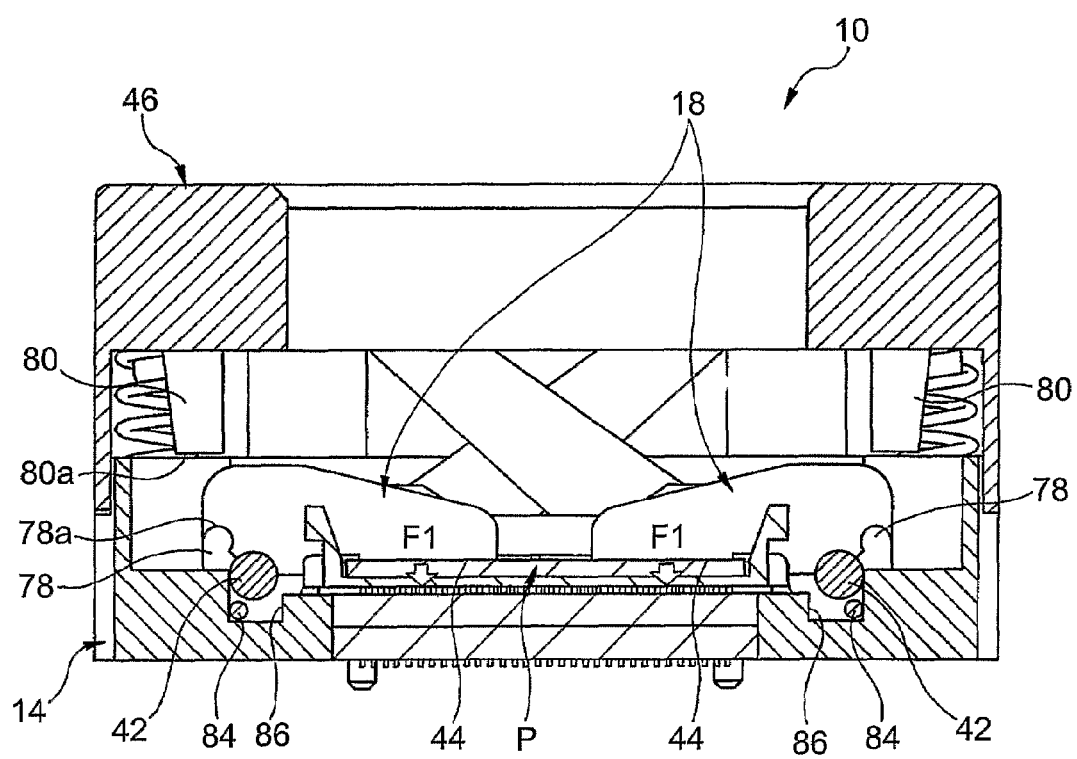
[FIG. 15] A cross-sectional view, along still another line, of the IC socket of FIG. 1 with the pressing members in closed positions.

While the pressing members 18 are at the closed positions, the shoulders 74 of the pressing members 18 strike the corresponding grooves 76 of the housing 14 to prevent pivot motion of the pressing members 18 toward the open positions. Therefore, at this time, if an IC device P is placed at the support guide member 32, the forces F1 applied to the pivots 42 of the pressing members 18 are applied substantially as they are from the pressing surfaces 44 at the operating positions to the IC device P as the pressing forces F1 (FIG. 15). As a result, the plurality of contacts 16 with the contact parts 16a sticking out into the center opening 38 of the support guide member 32 receive the pressing forces from the plurality of leads Q of the IC device P to elastically deform and therefore the individual leads Q and contact parts 16a of the contacts 16 are made to abut against each other and are electrically connected under a predetermined contact pressure.

If pressing the cover 46 in the direction approaching the housing 14 (arrow α of FIG. 10) against the biasing forces of the elastic members 56 from the above maximum separation position, due to the action of the levers 58, guide grooves 66, and stopping elements 84 explained above, the pressing members 18 move in parallel displacement in the direction where their pressing surfaces 44 move away from the support guide members 32 (arrow β in FIG. 10). Due to this, the pressing surfaces 44 of the pressing members 18 move in parallel displacement from the operating positions to reach the first nonoperating positions (FIG. 10). At the same time, if an IC device P is placed on the support guide member 32, the pressing forces F1 from the pressing surfaces 44 of the pressing members 18 are released, the plurality of contacts 16 elastically return, and the contact pressure between the individual leads Q of the IC device P and the contact parts 16a of the corresponding contacts 16 is released. Here, it is also possible to elastically support the support guide member 32 on the housing 14 by not shown elastic members so that the leads Q of the IC device and the contact parts 16a of the contacts 16 separate when the pressing forces F1 from the pressure surfaces 44 of the pressing members 18 are released.

Figure 13:
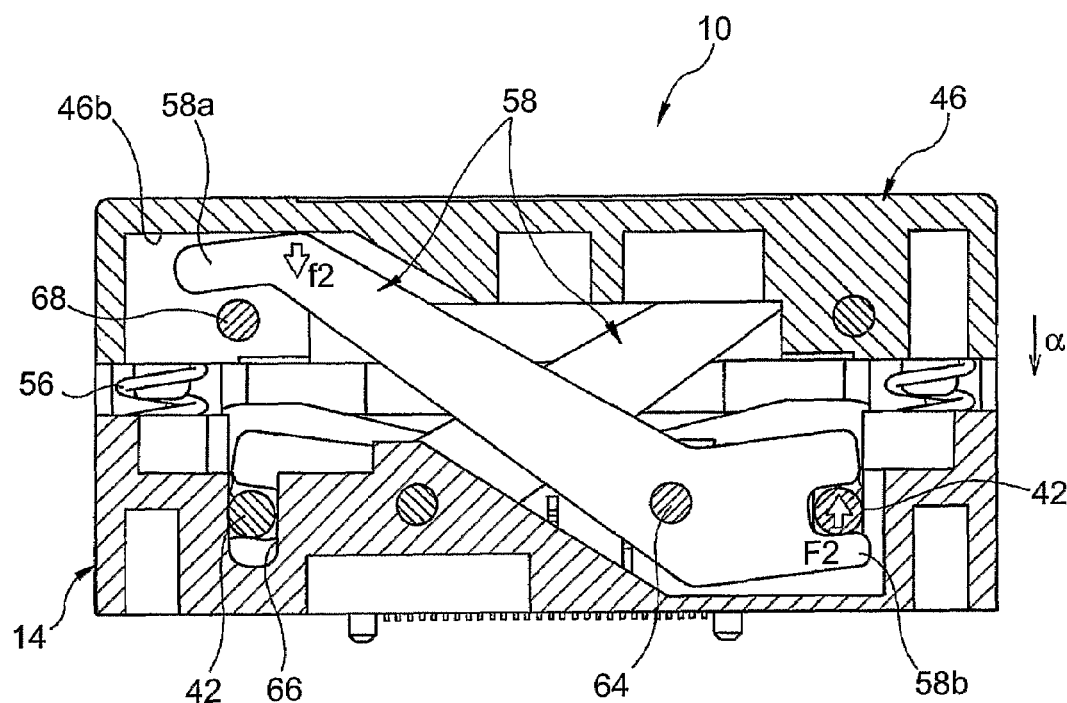
[FIG. 13] A cross-sectional view, along another line, of the IC socket of FIG. 1 with the pressing members in intermediate positions.
Figure 16:
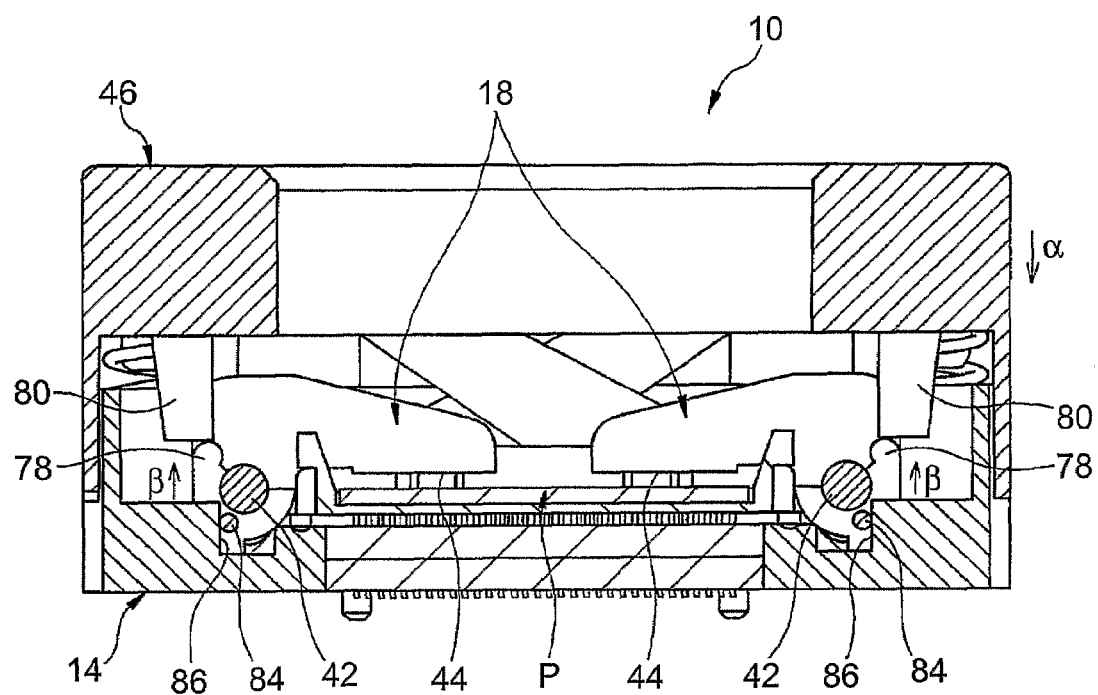
[FIG. 16] A cross-sectional view, along still another line, of the IC socket of FIG. 1 with the pressing members in intermediate positions.

During the above parallel displacement motion, the external force applied to the cover 46 in the direction approaching the housing 14 is applied from the back surface 46b of the cover 46 to the first engaging ends 58a of the four levers 58 as equally divided downward forces f2 (FIG. 13). These forces f2 are based on the vertical modulii of elasticity (or spring constants) of the elastic members 56, are increased by the multiplying-force action of the levers 58, and are applied from the second engaging ends 58b to the corresponding pivots 42 as upward forces F2. Further, when the pressing surfaces 44 of the pressing members 18 reach the first nonoperating positions, as explained above, the corresponding extension pieces 80 of the cover 46 strike the receiving parts 78 of the individual pressing members 18 (FIG. 16).

If pressing the cover 46 in further in the direction approaching the housing 14 (arrow α of FIG. 11) against the biasing forces of the elastic members 56 and the second elastic members 82 from the above intermediate position, due to the action of the receiving parts 78 and extension pieces 80 explained above, the pressing members 18 pivot in the direction where their pressing surfaces 44 move further away from the support guide members 32 (arrow γ in FIG. 11). At the same time, due to the action of the levers 58 and guide grooves 66, the pressing members 18 move linearly in the direction of the arrow β at their pivots 42. Under this combined action, the pressing surfaces 44 of the pressing members 18 swing from the first nonoperating positions to the second nonoperating positions and the pair of pressing members 18 are arranged at the open positions (FIG. 11). In this state, the support guide member 32 is opened largely above, so an IC device P can be accurately inserted into or taken out of the support guide member 32 through the center opening 48 of the cover 46.

Figure 14:
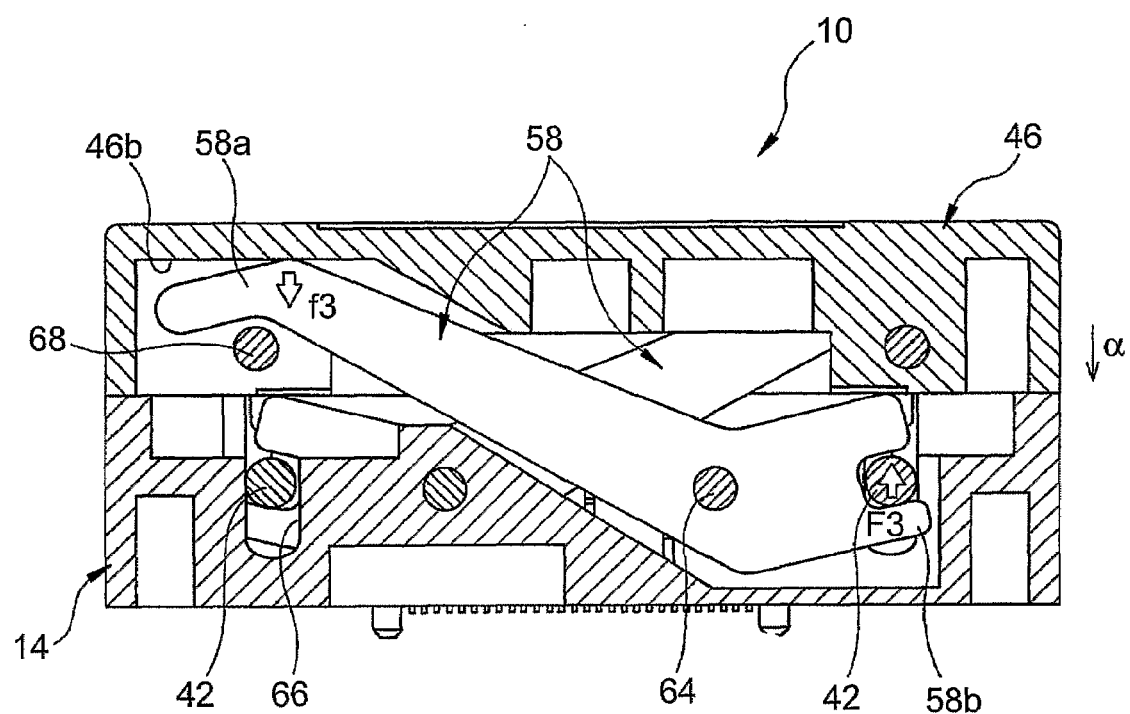
[FIG. 14] A cross-sectional view, along another line, of the IC socket of FIG. 1 with the pressing members in open positions.
Figure 17:
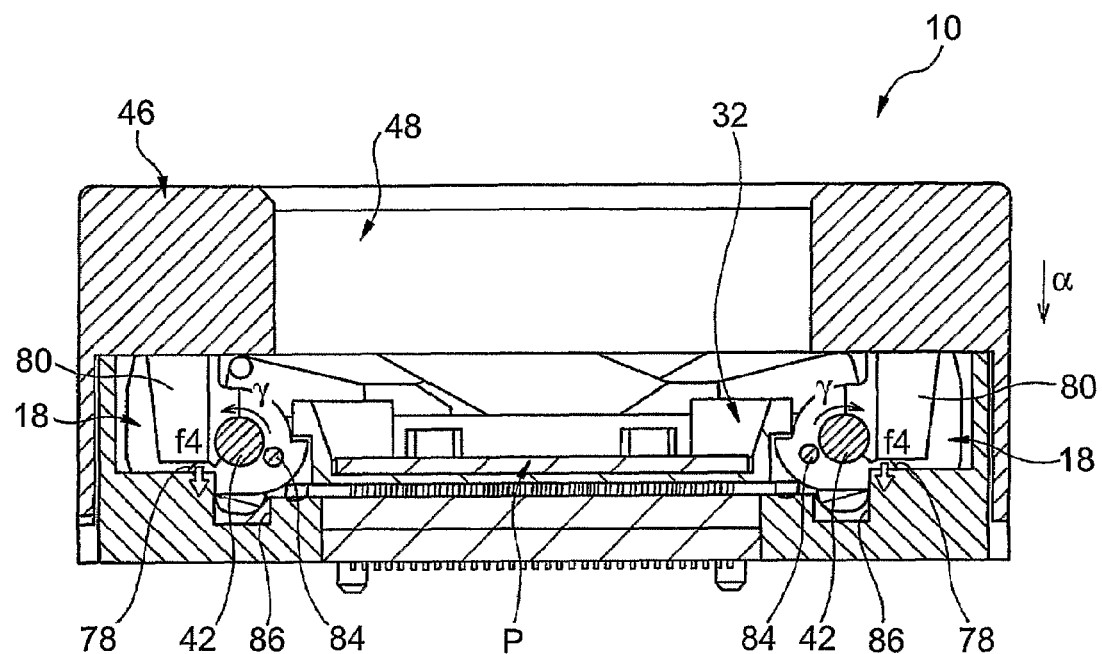
[FIG. 17] A cross-sectional view, along still another line, of the IC socket of FIG. 1 with the pressing members in open positions.

During the above opening motion, the external force applied to the cover 46 in the direction approaching the housing 14 is applied from the back surface 46b of the cover 46 to the first engaging ends 58c of the four levers 58 as equally divided downward forces f3 (FIG. 14). These forces f3 are based on the vertical modulii of elasticity (or spring constants) of the elastic members 56, are increased by the multiplying-force action of the levers 58, and are applied from the second engaging ends 58b to the corresponding pivots 42 as upward forces F3. At the same time, the external force applied to the cover 46 in the direction approaching the housing 14 is applied from the four extension pieces 80 of the cover 46 to the receiving parts 78 of the corresponding pressing members 18 as equally divided downward forces f4 (FIG. 17). These forces f4 are based on the vertical modulii of elasticity (or spring constants) of the second elastic members 82 and, as explained above, are sufficiently smaller than the forces f3.

When using the IC socket 10, when attaching an IC device P to an empty IC socket 10, the IC device P is loaded at the support guide member 32 (or the support 12) of the housing 14 through the center opening 48 of the cover 46 in the state where the pair of pressing members 18 are arranged at the open positions (FIG. 11) with respect to the IC socket 10 mounted on a not shown circuit board (that is, the state where the cover 46 is pressed to the position closest to the housing 14). Next, if releasing the external force on the cover 46 and making the cover 46 move in parallel displacement in a direction moving away from the housing 14 by the biasing forces of the four elastic members 56, as explained above, the pressing members 18 automatically pivot toward the closed positions under the action of the second elastic members 82 and along with this the pressing surfaces 44 swing from the second nonoperating positions to the first nonoperating positions (FIG. 10).

During this pivot motion, the elastic biasing forces of the four elastic members 56 are equally divided at the four shafts 68 attached to the cover 46 and applied from the shafts 68 to the first engaging ends 58a of the corresponding levers 58 as upward forces and are applied from the second engaging ends 58b to the pivots 42 as downward forces under the multiplying-force actions of the levers 58. That is, the biasing forces of the elastic members 56 biasing the cover 46 do not contribute to pivoting of the pressing members 18. The pressing members 18 pivot by the relatively small biasing forces of the second elastic members 82.

If continuing to release the external force on the cover 46, the cover 46 will reach the furthest position from the housing 14 due to the biasing forces of the four elastic members 56. During this time, the pressing surfaces 44 of the pressing members 18 move in parallel displacement from the first nonoperating positions to the operating positions due to the action of the above-mentioned levers 58, guide grooves 66, and stopping elements 84. When the pressing surfaces 44 of the individual pressing members 18 reach the operating positions, as explained above, due to the action of the fixing structures 72, required pressing forces based on the vertical modulii of elasticity (or spring constants) of the elastic members 56 are applied from the pressing surfaces 44 of the pressing members 18 and the IC device P is fixed held at the support guide member 32 (FIG. 9). As a result, the plurality of contacts 16 receive the pressing forces from the plurality of leads Q of the IC device P and elastically deform and therefore the individual leads Q and contact parts 16a of the contacts 16 are made to abut against each other and are electrically connected under a predetermined contact pressure.

In this way, according to the IC socket 10 having the above configuration, the elastic pressing forces of the elastic members 56 giving rise to the pressing forces on the IC device P at the pressing surfaces 44 of the pressing members 18 are increased by the multiplying-force action of the levers 58 and transmitted to the pivots 42 of the pressing members 18. Therefore, assuming obtaining the necessary contact pressure between the leads Q of the IC device P and the contact parts 16a of the contacts 16, compared with a structure without the multiplying-force action in the conventional IC socket, the vertical modulii of elasticity (or spring constants) of the elastic members 56 biasing the cover 46 can be reduced. As a result, when loading the IC device P at the support 12 of the housing 14, it is possible to reduce the force pressing the cover 46 toward the housing 14 compared with the conventional structure. Therefore, in the IC socket 10, flexing of the mounting board at the time of loading of the IC device is suppressed. Even when using automatic loading, it is possible to reliably push in the cover 46 toward the housing 14 to make the two pressing members 18 sufficiently pivot from the closed positions to the open positions, so it is possible to reliably load the IC device P at the support 12.

Further, in the IC socket 10, unlike the conventional structure where the biasing forces of the elastic members are applied to the lever points of lever shaped pressing members, the biasing forces are applied to the pivots 42 serving as the fulcrums (or the centers of pivot) of the pressing members 18 through the levers 58, so it is possible to secure a required multiplying-force action by suitably setting the dimensions of the levers 58 without affecting the dimensions of the pressing members 18. Further, since the levers 58 connected to the pair of pressing members 18 are arranged relative to each other perpendicularly intersecting in a X-shape, it is possible to easily increase the distance from the fulcrums (or the pivots 64) of the levers 58 to the lever points (first engaging ends 58*a*) without increasing the external dimensions of the housing 14.

Further, in the IC socket 10, when moving the pressing members 18 from the closed positions to the open positions, if making the receiving parts 78 near the fulcrums (or the pivots 42) of the pressing members 18 bear the pressing force of the cover 46, it is possible to make the working points (or the pressing surfaces 44) move by large amounts even with small amounts of movement of the lever points (or the receiving parts 78) of the pressing members 18. Therefore, even when limiting the amount of pressing of the cover 46 to a range not impairing its operability, it is possible to enlarge the dimensions of the pressing surfaces 44 of the pressing members 18 without interfering with the loading of the IC device P to the support 12. As a result, it is possible to make the dimensions of the pressing surfaces 44 of the pressing members 18 close to the dimensions of the IC device P, so it is possible to avoid concentration of pressing force at local parts of the IC device P and in particular prevent damage due to the pressing force in a thin IC device P.

Further, in the IC socket 10, the pressing surfaces 44 of the pressing members 18 are designed to apply pressing forces to the IC device P while moving in parallel displacement from the first nonoperating positions to the operating positions. Therefore, compared with the conventional structure where pressing surfaces of the pressing members press against the IC device while pivoting, it is possible to prevent in advance the occurrence of positional offset in the IC device P on the support 12 when applying pressing force. Therefore, in the IC socket 10, it is possible to easily secure accurate and stable connection of the plurality of leads Q of the IC device P and the contact parts 16*a* of the corresponding contacts 16.

The IC socket according to the present invention can be formed from various materials. For example, in the above embodiments, the housing 14, support guide member 32, contact holding member 40, cover 46, and levers 58 can be integrally formed by for example injection molding from electrically insulating materials superior in heat resistance and mechanical strength such as PPS (polyphenylene sulfide), PBT (polybutylene terephthalate), PEI (polyether imide), and PES (polyether sulfone). Further, the contacts 15 are preferably comprised of barium copper, phosphor bronze, or another metal material having springiness. At least the contact parts 16*a* of these contacts are preferably plated by nickel.

While preferred embodiment of the present invention were explained above, the configuration of the IC socket according to the present invention is not limited these embodiments. In particular, the shapes, numbers, arrangements, etc. of the components can be modified in various ways.

What is claimed is:

1. An IC socket comprising a housing configured to mate with a cover having a support for supporting an IC device, a plurality of contacts with contact parts arranged elastically displaceably at said support, a pressing member for pressing said IC device supported at the support to make a plurality of leads of said IC device abut against said contact parts of said plurality of contacts, and a biasing mechanism for generating a pressing force for pressing said IC device at said pressing member, said pressing member has a pivot guided linearly in a vertical direction on said housing and a pressing surface swingable about said pivot on said housing, and said biasing mechanism applies a biasing force to said pivot of said pressing member so as to cause said pressing force at said pressing surface.

2. An IC socket as set forth claim 1, further comprising an operating member for operating said pressing member to make said pressing surface displace on said housing, wherein said operating member is linked with said biasing mechanism.

3. An IC socket as set forth in claim 1, wherein said pressing surface of said pressing member moves in parallel displacement between an operating position where it is closest to said support and a first nonoperating position where it is away from said support and swings between said first nonoperating position and a second nonoperating position further away from said support.

4. An IC socket as set forth in claim 3, wherein said housing has a guide groove for engaging with said pivot and linearly guiding said pivot during a period when said pressing surface of said pressing member displaces between said operating position and said second nonoperating position.

5. An IC socket as set forth in claim 3, further provided with a fixing structure for mechanically fixing said pressing member in a pivot direction when said pressing surface is at said operating position.

6. An IC socket comprising a housing configured to mate with a cover having a support for supporting an IC device, a plurality of contacts with contact parts arranged elastically displaceably at said support, a pressing member for pressing said IC device supported at the support to make a plurality of leads of said IC device abut against said contact parts of said plurality of contacts, and a biasing mechanism for generating a pressing force for pressing said IC device at said pressing member, an operating member for operating said pressing member to make said pressing surface displace on said housing, wherein said operating member is linked with said biasing mechanism, said pressing member having a pivot guided linearly in a vertical direction on said housing and a pressing surface swingable about said pivot on said housing, and wherein said biasing mechanism applies a biasing force to said pivot of said pressing member so as to cause said pressing force at said pressing surface and wherein said pressing member receives operating force from said operating member at said pivot and has a receiving part, separate from said pivot, for receiving operating force from said operating member, and wherein a distance between said pressing surface and said pivot is larger than a distance between said receiving part and said pivot.

7. An IC socket as set forth in claim 6, wherein said operating member is provided with a cover arranged to be able to move in a direction toward and away from said housing, and wherein said biasing mechanism is provided with an elastic member for elastically biasing said cover in a direction away from said housing and a lever for transmitting force applied to said lever from said elastic member to said pivot as said biasing force.

8. An IC socket as set forth in claim 7, wherein said lever is provided with a first engaging end for engaging with said cover in an interactive manner, a second engaging end for engaging with said pivot in an interactive manner, and an axis part positioned between said first engaging end and said second engaging end, and is attached at said axis part to said housing in a pivotable manner, and wherein a distance between said first engaging end and said axis part is larger than a distance between said second engaging end and said axis part.

9. An IC socket as set forth in claim 7, further comprising a second elastic member for elastically biasing said pressing member in a pivot direction toward said support on said housing.

10. An IC socket as set forth in claim 9, wherein a vertical modulus of elasticity of said second elastic member is smaller than a vertical modulus of elasticity of said elastic member biasing said cover.

11. An IC socket as set forth in claim 9, further comprising a stopping element for stopping said pressing member at a predetermined pivot position against the biasing force of said second elastic member.

* * * * *

UNITED STATES PATENT AND TRADEMARK OFFICE
CERTIFICATE OF CORRECTION

PATENT NO. : 7,666,016 B2  Page 1 of 1
APPLICATION NO. : 11/568956
DATED : February 23, 2010
INVENTOR(S) : Masahiko Kobayashi It is certified that error appears in the above-identified patent and that said Letters Patent is hereby corrected as shown below:

Column 9,
Line 55, delete "engagable" and insert --engageable-- therefor.

Column 12,
Line 22, delete "an" and insert --and-- therefor.

Column 15,
Line 40, delete "γin" and insert --γ in-- therefor.

Column 18,
Line 19, Claim 2, delete "forth claim" and insert --forth in claim-- therefor.

Signed and Sealed this

Thirty-first Day of August, 2010

David J. Kappos
*Director of the United States Patent and Trademark Office*